(12) United States Patent
Harasaka et al.

(10) Patent No.: US 8,441,511 B2
(45) Date of Patent: May 14, 2013

(54) SURFACE-EMITTING LASER ELEMENT INCLUDING DIELECTRIC FILM SELECTIVELY PROVIDED TO CONTROL REFLECTANCE IN EMISSION REGION, SURFACE-EMITTING LASER ARRAY, OPTICAL SCANNER DEVICE, AND IMAGE FORMING APPARATUS

(75) Inventors: Kazuhiro Harasaka, Miyagi (JP); Shunichi Sato, Miyagi (JP); Naoto Jikutani, Miyagi (JP); Satoru Sugawara, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 145 days.

(21) Appl. No.: 12/910,262

(22) Filed: Oct. 22, 2010

(65) Prior Publication Data

US 2011/0115872 A1 May 19, 2011

(30) Foreign Application Priority Data

Nov. 17, 2009 (JP) .................................. 2009-261510
Jul. 13, 2010 (JP) .................................. 2010-158487

(51) Int. Cl.
*B41J 2/45* (2006.01)
*H01S 5/00* (2006.01)

(52) U.S. Cl.
USPC ..................................... 347/238; 372/46.011

(58) Field of Classification Search .................. 347/224, 347/225, 238; 372/19, 45.01, 46.01, 49.01, 372/50.124
See application file for complete search history.

(56) References Cited

U.S. PATENT DOCUMENTS

| | | | |
|---|---|---|---|
| 5,357,123 A | 10/1994 | Sugawara | |
| 5,923,691 A | 7/1999 | Sato | |
| 5,939,733 A | 8/1999 | Sato | |
| 5,940,422 A * | 8/1999 | Johnson | ..................... 372/45.01 |
| 6,002,700 A | 12/1999 | Sato | |
| 6,072,196 A | 6/2000 | Sato | |
| 6,207,973 B1 | 3/2001 | Sato et al. | |
| 6,233,264 B1 | 5/2001 | Sato | |

(Continued)

FOREIGN PATENT DOCUMENTS

| EP | 1130720 A1 | 9/2001 |
|---|---|---|
| EP | 1496583 A1 | 1/2005 |

(Continued)

OTHER PUBLICATIONS

Feb. 24, 2011 European search report in connection with counterpart European patent application No. 10 19 0038.

*Primary Examiner* — Hai C Pham
(74) *Attorney, Agent, or Firm* — Cooper & Dunham LLP

(57) ABSTRACT

A disclosed surface-emitting laser element includes a substrate, multiple semiconductor layers stacked on the substrate including a resonator structure including an active layer, a semiconductor multilayer mirror on the resonator structure, and a confined structure where a current passage region is enclosed by at least an oxide generated by oxidation of part of a selective oxidation layer containing aluminum, an electrode provided around an emission region, and a dielectric film provided in a peripheral portion within the emission region and outside a central portion of the emission region to make a reflectance of the peripheral portion lower than that of the central portion. The dielectric film is arranged such that a reflectance of a high-order transverse mode in a second direction is higher than that in a first direction, and a width of the current passage region in the first direction is greater than that in the second direction.

20 Claims, 40 Drawing Sheets

U.S. PATENT DOCUMENTS

| | | | |
|---|---|---|---|
| 6,542,528 B1 | 4/2003 | Sato et al. | |
| 6,563,851 B1 | 5/2003 | Jikutani et al. | |
| 6,614,821 B1 | 9/2003 | Jikutani et al. | |
| 6,639,931 B1 | 10/2003 | Dowd et al. | |
| 6,674,785 B2 | 1/2004 | Sato et al. | |
| 6,765,232 B2 | 7/2004 | Takahashi et al. | |
| 6,803,604 B2 | 10/2004 | Takahashi et al. | |
| 6,816,527 B2* | 11/2004 | Ueki | 372/46.01 |
| 6,927,412 B2 | 8/2005 | Takahashi et al. | |
| 6,959,025 B2 | 10/2005 | Jikutani et al. | |
| 6,975,663 B2 | 12/2005 | Sekiya et al. | |
| 7,002,527 B2 | 2/2006 | Sugawara | |
| 7,466,738 B2 | 12/2008 | Jikutani | |
| 7,542,499 B2 | 6/2009 | Jikutani | |
| 7,684,458 B2 | 3/2010 | Sato et al. | |
| 7,693,204 B2 | 4/2010 | Sato et al. | |
| 7,720,125 B2 | 5/2010 | Jikutani et al. | |
| 7,746,912 B2 | 6/2010 | Motomura et al. | |
| 7,800,805 B2 | 9/2010 | Hayashi et al. | |
| 7,957,444 B2* | 6/2011 | Itoh et al. | 372/46.01 |
| 8,077,752 B2* | 12/2011 | Maeda et al. | 372/45.01 |
| 2002/0006143 A1 | 1/2002 | Nakayama et al. | |
| 2002/0172247 A1 | 11/2002 | Sopra et al. | |
| 2003/0063649 A1 | 4/2003 | Ezaki et al. | |
| 2007/0014324 A1* | 1/2007 | Maeda et al. | 372/46.01 |
| 2007/0091959 A1 | 4/2007 | Royo | |
| 2008/0055672 A1 | 3/2008 | Watanabe et al. | |
| 2008/0233017 A1 | 9/2008 | Sato et al. | |
| 2009/0129417 A1 | 5/2009 | Maeda et al. | |
| 2009/0180506 A1 | 7/2009 | Maeda et al. | |
| 2009/0262770 A1 | 10/2009 | Itoh et al. | |
| 2009/0285252 A1 | 11/2009 | Ishii et al. | |
| 2009/0285602 A1 | 11/2009 | Harasaka et al. | |
| 2009/0295902 A1 | 12/2009 | Sato et al. | |
| 2009/0303308 A1 | 12/2009 | Itoh et al. | |
| 2009/0310632 A1 | 12/2009 | Sugawara et al. | |
| 2010/0046565 A1* | 2/2010 | Masui et al. | 372/45.01 |
| 2010/0060712 A1 | 3/2010 | Sato et al. | |
| 2010/0214633 A1 | 8/2010 | Sato et al. | |

FOREIGN PATENT DOCUMENTS

| | | |
|---|---|---|
| JP | 3566902 | 6/2004 |
| JP | 2004-289033 | 10/2004 |
| JP | 3955925 | 5/2007 |
| JP | 2007-201398 | 8/2007 |
| JP | 2010153768 A * | 7/2010 |
| WO | WO2005/082010 A2 | 9/2005 |

* cited by examiner

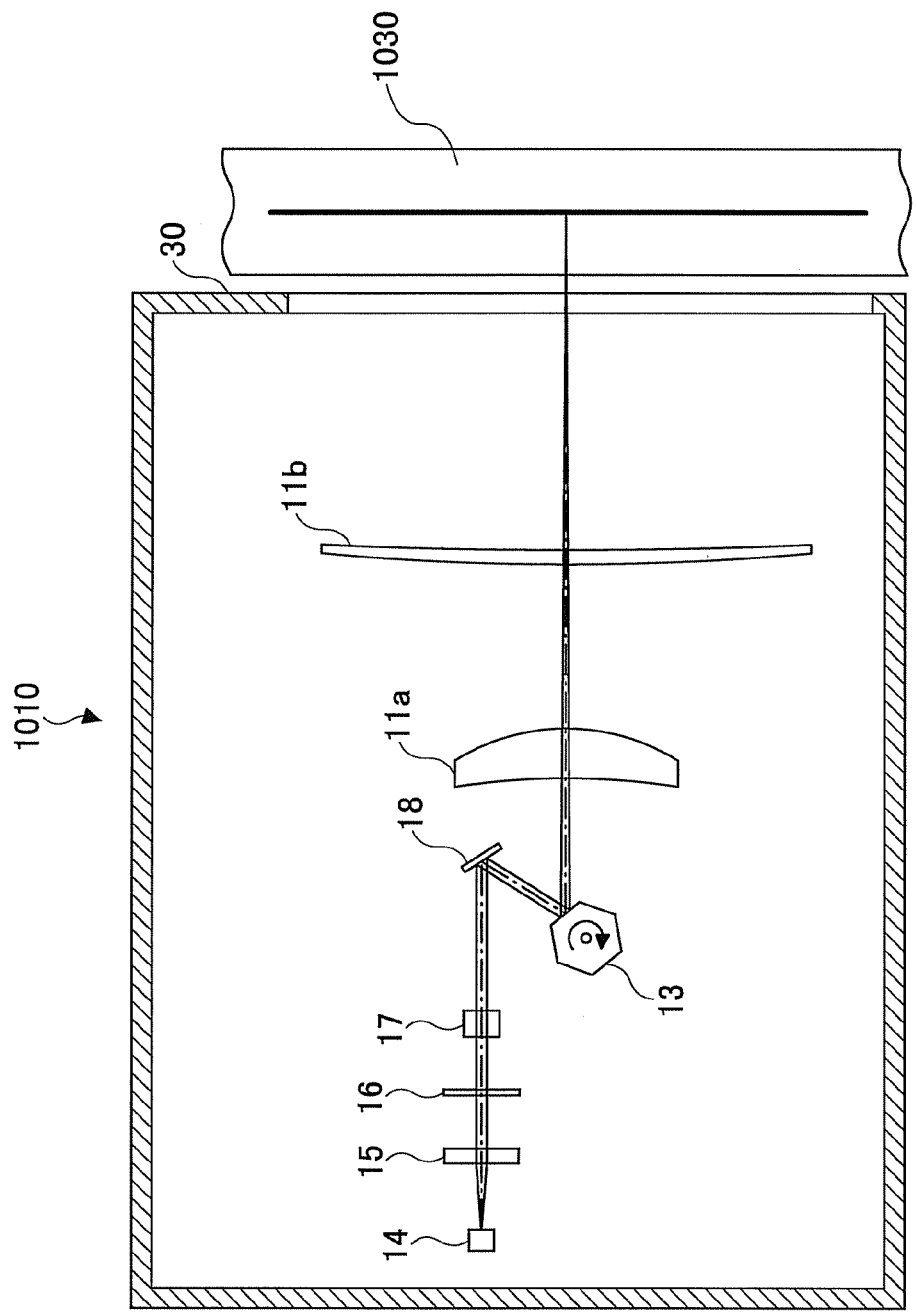

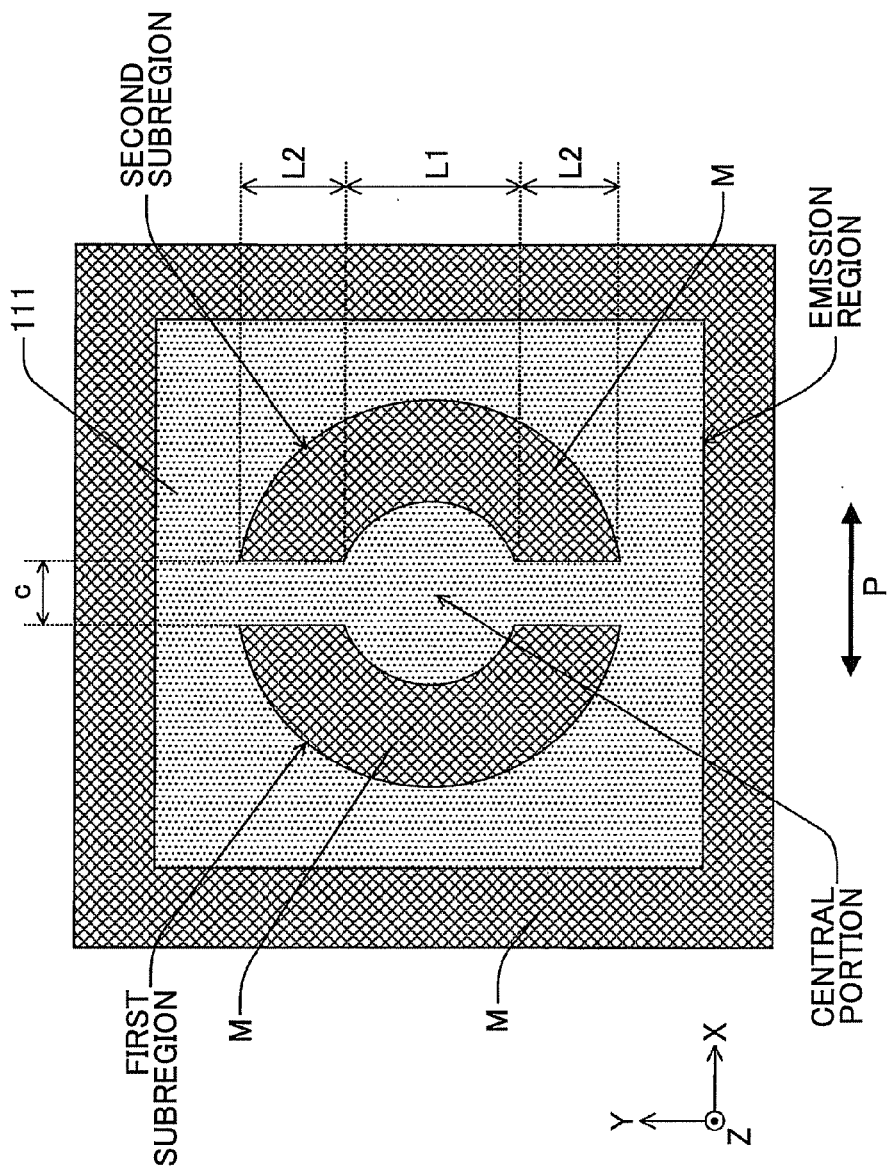

FIG.19

| No | SHAPE OF CURRENT PASSAGE REGION ||||  SINGLE MODE OUTPUT [mW] |||
|---|---|---|---|---|---|---|---|
|  | Ly [mm] | Lx [mm] | AREA [mm²] | RECTANGULARITY | BEFORE TEST | AFTER TEST | CHANGE RATIO |
| 1 | 3.76 | 4.40 | 16.5 | 0.85 | 2.33 | 2.31 | 0.99 |
| 2 | 3.84 | 4.32 | 16.6 | 0.89 | 2.39 | 2.33 | 0.97 |
| 3 | 3.92 | 4.32 | 16.9 | 0.91 | 2.39 | 2.37 | 0.99 |
| 4 | 4.00 | 4.08 | 16.3 | 0.98 | 2.34 | 2.31 | 0.99 |
| 5 | 4.08 | 4.00 | 16.3 | 1.02 | 2.45 | 2.27 | 0.93 |
| 6 | 4.00 | 3.92 | 15.7 | 1.02 | 2.41 | 2.27 | 0.94 |
| 7 | 4.32 | 3.84 | 16.6 | 1.13 | 2.40 | 2.09 | 0.87 |
| 8 | 4.32 | 3.76 | 16.2 | 1.15 | 2.60 | 2.43 | 0.93 |
| 9 | 4.40 | 3.68 | 16.2 | 1.20 | 2.11 | 1.76 | 0.83 |
| 10 | 4.40 | 3.68 | 16.2 | 1.20 | 2.32 | 1.99 | 0.86 |
| 11 | 4.56 | 3.68 | 16.8 | 1.24 | 2.22 | 1.89 | 0.85 |

SURFACE-EMITTING LASER ELEMENT INCLUDING DIELECTRIC FILM SELECTIVELY PROVIDED TO CONTROL REFLECTANCE IN EMISSION REGION, SURFACE-EMITTING LASER ARRAY, OPTICAL SCANNER DEVICE, AND IMAGE FORMING APPARATUS

BACKGROUND OF THE INVENTION

1. Field of the Invention

The invention generally relates to surface-emitting laser elements, surface-emitting laser arrays, optical scanner devices and image forming apparatuses, and more particularly to a surface-emitting laser element capable of emitting a laser beam in a direction perpendicular to a substrate, a surface-emitting laser array including therein a plurality of such surface-emitting laser elements, an optical scanner device having such a surface-emitting laser array, and an image forming apparatus having such an optical scanner device.

2. Description of the Related Art

In the art of vertical cavity surface emitting lasers (i.e., VCSELs), controlling a high-order oscillation transverse mode of a laser beam and regulating a polarization direction of a laser beam in a desirable direction are important factors in applied VCSEL technologies, and various attempts have been made regarding the control of the high-order oscillation transverse mode of a laser beam and the regulation of the polarization direction of a laser beam in the desirable direction.

Japanese Patent No. 3566902 (hereinafter referred to as "Patent Document 1") discloses a surface emission semiconductor laser element in which the oscillation transverse mode of a laser beam is controlled. In the surface emission semiconductor laser element, a layer structure of semiconductor materials, where an emission layer is sandwiched between upper and lower reflector layer structures, is formed on a substrate. An opening located above the upper reflector layer structure is coated with upper electrode layers having a circular plan view, and being transparent for the oscillation wavelength of laser light.

Japanese Patent No. 3955925 (hereinafter referred to as "Patent Document 2") discloses a vertical cavity surface emitting laser device having an opening portion and a semiconductor discontinuity portion formed within the body of the device at a position distant from an edge of the opening portion. The semiconductor discontinuity portion is formed of a slit that is filled with a material differing from the semiconductor material, and a side wall of the semiconductor discontinuity portion has an opening of the slit formed such that the side wall is extended in a desirable direction of polarization of laser light emitted from the laser device that is substantially aligned with a boundary of the discontinuity portion.

Further, Japanese Patent Application Publication No. 2007-201398 (hereinafter referred to as "Patent Document 3") discloses a surface-emitting semiconductor laser element that includes a substrate, a first multilayer reflection film on the substrate, an active layer having a light emitting central region formed on the first multilayer reflection film, a second multilayer reflection film formed on the active layer having the light emitting central region, and a laser transverse mode adjusting layer formed on the second multilayer reflection film. At least one of the first multilayer reflection film and the second multilayer reflection film includes a quadrilateral current injection region having its intersection of diagonal lines disposed at the light emitting central region of the active layer, and the second multilayer reflection film includes a light emitting window provided in a region corresponding to one of the diagonal lines of the current injection region, and a pair of grooves one groove located at each side of the light emitting window. The laser transverse mode adjusting layer is provided corresponding to the light emitting window and having a peripheral region excluding the central region of the light emitting window having a reflection factor lower than that of a region of the light emitting window corresponding to the light emitting central region of the active layer.

Japanese Patent Application Publication No. 2004-289033 (hereinafter referred to as "Patent Document 4") discloses a surface-emitting semiconductor laser element that includes a first multilayer reflection film, an active layer formed on the first multilayer reflection film, and a second multilayer reflection film formed on the active layer. At least one layer of the first multilayer reflection film and the second multilayer reflection film includes a first region disposed at least at the part of a region corresponding to a part of the active layer, and having a thickness of substantially $\lambda/4n$ ($\lambda$: oscillation wavelength, n: refractive index); and a second region disposed on a region excluding the first region and having a thickness of substantially excepting $\lambda/4n$.

However, although the vertical cavity surface emitting laser device disclosed in Patent Document 2 is capable of regulating the polarization direction, it may still be difficult to suppress the oscillation of the high-order transverse mode of a laser beam due to a change in a laser light confinement effect in a transverse direction based on depths of grooves.

Further, in the surface-emitting semiconductor laser element disclosed in Patent Document 3, if the gap between the grooves is made narrower than the current confined region for regulating the polarization direction, a current passage region may be substantially reduced (narrowed). This has increased electric resistance or electric current density, thereby reducing the service life-span of the laser element.

Moreover, in the surface-emitting semiconductor laser element disclosed in Patent Document 4, the growth of the crystal is temporarily stopped after allowing the crystal to grow up to a layer adjacent to the active layer. The crystals are then allowed to grow again after patterning of the resist and etching of the film are carried out. In this case, when the crystal growth is initiated again, the etched surface of the film may affect the crystal growth, which may bring variability in the characteristics of the laser element or in the control characteristics of the transverse mode of a laser beam. Thus, the laser element may not be suitable for mass production.

The applicants of the present application have conducted various experiments to examine the control of a high-order oscillation transverse mode of a laser beam and the regulation of a polarization direction of a laser beam in a desirable direction, and have found that a polarization mode suppression ratio PMSR may be lowered, in comparison to a case where the reflectance within the emission region is uniform, if a circular low reflectance portion is provided within the emission region of a surface-emitting semiconductor laser element as disclosed in Patent Document 1. Note that the polarization mode suppression ratio PMSR is a ratio of light intensity of a desired polarization direction of laser light to light intensity of a direction perpendicular to the desired polarization direction of laser light.

Thus, even if the surface-emitting laser element is capable of controlling the polarization direction in one direction based on gain anisotropy of the active layer obtained by providing a slanted substrate, the polarization direction may become unstable by providing the circular low reflectance portion in the emission region.

As described above, the applicants of the present application have found that the shape of the low reflectance portion may significantly affect the stability of the polarization.

SUMMARY OF THE INVENTION

It is a general object of at least one embodiment of the present invention to provide a surface-emitting laser element capable of emitting a laser beam in a direction perpendicular to a substrate, a surface-emitting laser array including a plurality of such surface-emitting laser elements, an optical scanner device having such a surface-emitting laser array, and an image forming apparatus having such an optical scanner device that substantially eliminate one or more problems caused by the limitations and disadvantages of the related art.

In one embodiment, there is provided a surface-emitting laser element that includes: a substrate; multiple semiconductor layers stacked on the substrate, the semiconductor layers including a resonator structure including an active layer, a semiconductor multilayer mirror on the resonator structure, and a confined structure where a current passage region is enclosed by at least an oxide generated by oxidation of a part of a selective oxidation layer containing aluminum; an electrode provided around an emission region of a light-emitting surface; and a dielectric film provided in a peripheral portion within the emission region and outside a central portion of the emission region to make a reflectance of the peripheral portion lower than a reflectance of the central portion. In the surface-emitting laser element, the dielectric film is arranged such that a reflectance of a high-order transverse mode of a laser beam in a second direction perpendicular to a first direction is higher than a reflectance of the high-order transverse mode of the laser beam in the first direction, and a width of the current passage region in the first direction is greater than a width of the current passage region in the second direction.

In another embodiment, there is provided a surface-emitting laser array that includes a plurality of the surface-emitting laser elements described above.

In another embodiment, there is provided an optical scanner device optically scanning a scanning surface with light. The optical scanner device includes: a light source including a surface-emitting laser element; a deflector configured to deflect the light emitted from the light source; and a scanning optical system configured to converge the light deflected by the deflector onto the scanning surface.

In another embodiment, there is provided an optical scanner device optically scanning a scanning surface with light. The optical scanner device includes: a light source including a surface-emitting laser array; a deflector configured to deflect the light emitted from the light source; and a scanning optical system configured to converge the light deflected by the deflector onto the scanning surface.

In another embodiment, there is provided an image forming apparatus that includes: at least one image carrying member; and at least one optical scanning device configured to scan light modulated based on image information on the image carrying member.

BRIEF DESCRIPTION OF THE DRAWINGS

Other objects and further features of embodiments will become apparent from the following detailed description when read in conjunction with the accompanying drawings, in which:

FIG. 2 is a schematic diagram illustrating an optical scanner device provided in the laser printer in FIG. 1;

FIG. 8 is an enlarged diagram illustrating an upper surface of a mesa structure cut out of the surface-emitting laser element illustrated in FIG. 7;

FIG. 19 is a table illustrating a shape of the current passage region provided in a test surface-emitting laser element and the results of a single mode output in an acceleration test;

DESCRIPTION OF THE PREFERRED EMBODIMENTS

In the following, embodiments of the present invention are described with reference to the accompanying drawings.

Figure 1:
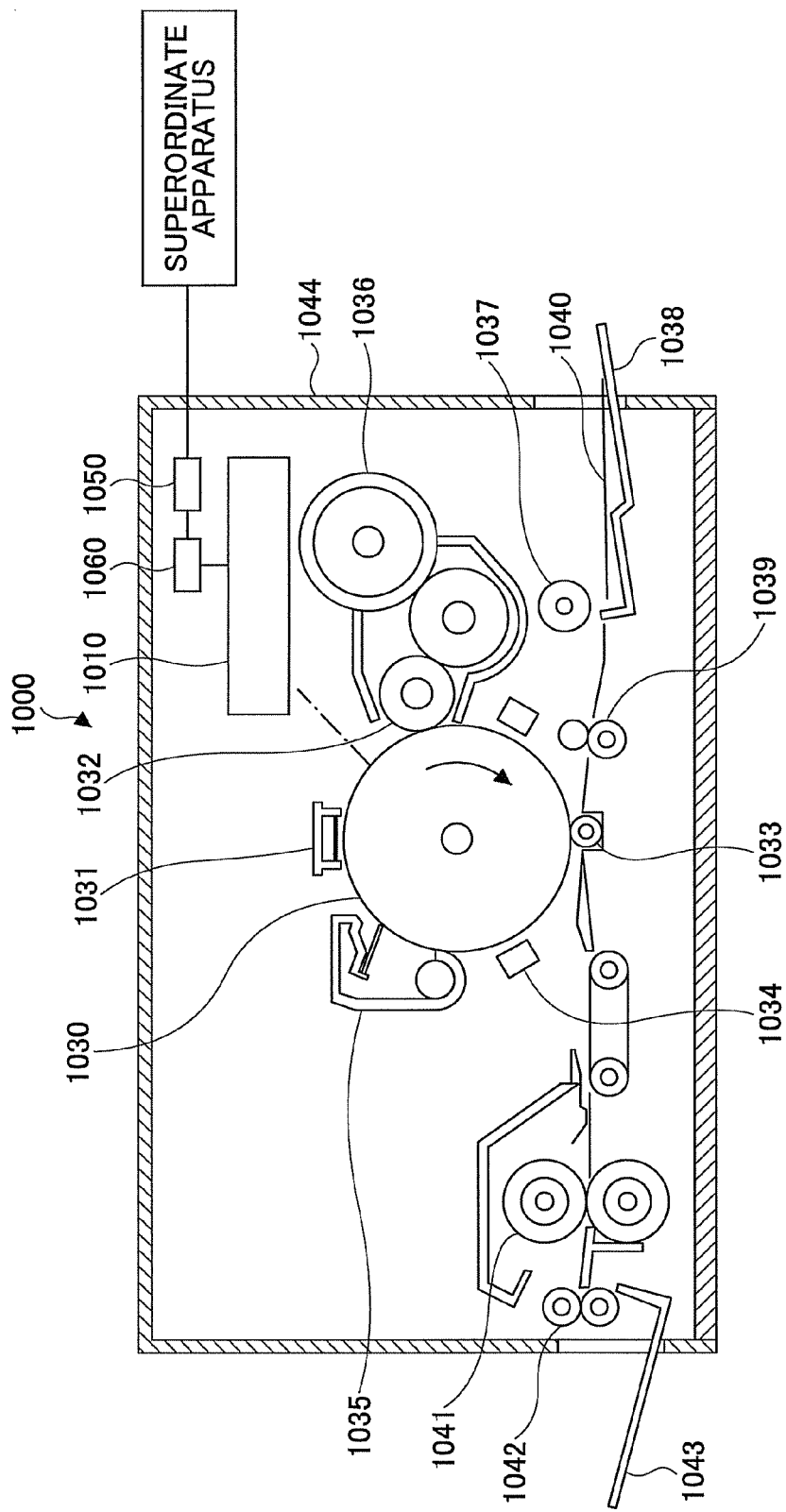
FIG. 1 is a schematic diagram illustrating a configuration of a laser printer according to an embodiment.

FIG. 1 is a schematic diagram illustrating a configuration of a laser printer 1000 according to an embodiment.

The laser printer 1000 includes an optical scanner device 1010, a photoreceptor drum 1030, an electrostatic charger 1031, a developing roller 1032, a transfer charger 1033, a static eliminator unit 1034, a cleaning unit 1035, a toner cartridge 1036, a paper feeding roller 1037, a paper feeding tray 1038, a resist roller pair 1039, a fixing roller 1041, a discharge roller 1042, a discharge tray 1043, a communication controller 1050, and a printer controller 1060 that overall controls these components of the laser printer 1000. Note that the above components are arranged in corresponding predetermined positions inside a printer case 1044.

The communication controller 1050 controls bidirectional communication with superordinate apparatuses such as personal computers via the network.

The photoreceptor drum 1030 is made of a cylindrical member having a photosensitive layer formed on its surface. That is, the surface of the photoreceptor drum 1030 is scanned. The photoreceptor drum 1030 is configured to rotate in a direction indicated by an arrow in FIG. 1.

The electrostatic charger 1031, the developing roller 1032, the transfer charger 1033, the static eliminator unit 1034, and the cleaning unit 1035 are arranged near the surface of the photoreceptor drum 1030. More specifically, the electrostatic charger 1031, the developing roller 1032, the transfer charger 1033, the static eliminator unit 1034, and the cleaning unit 1035 are arranged in this order near the surface of the photoreceptor drum 1030 in a rotational direction of the photoreceptor drum 1030.

The electrostatic charger 1031 is configured to uniformly charge the surface of the photoreceptor drum 1030.

The optical scanner device 1010 scans the surface of the photoreceptor 1030 electrostatically charged by the electrostatic charger 1031 with luminous flux modulated based on image information acquired from the superordinate apparatuses to form a latent image corresponding to the acquired image information on the surface of the photoreceptor drum 1030. The latent image formed on the surface of the photoreceptor drum 1030 travels with the rotation of the photoreceptor drum 1030 in a direction toward the developing roller 1032. Note that a configuration of the optical scanner device 1010 is described later.

The toner cartridge 1036 contains toner, which is supplied to the developing roller 1032.

The developing roller 1032 applies the toner supplied from the toner cartridge 1036 to the latent image formed on the surface of the photoreceptor drum 1030 to make the latent image visible. Note that the latent image with the toner applied (hereinafter also called a "toner image" for convenience) travels with the rotation of the photoreceptor 1030 in a direction toward the transfer charger 1033.

The paper feeding tray 1038 contains sheets of recording paper 1040. The paper feeding roller 1037 is arranged near the paper feeding tray 1038 to pick one sheet of the recording paper 1040 from the paper feeding tray 1038 and then transfer the picked recording sheet 1040 to a resist roller pair 1039. The resist roller pair 1039 temporarily holds the recording sheet 1040 picked by the paper feeding roller 1037 and transfers it into a gap between the photoreceptor drum 1030 and the transfer charger 1033 with the rotation of the photoreceptor drum 1030.

The transfer charger 1033 has applied a voltage having a polarity opposite to the polarity of the toner such that the toner applied on the surface of the photoreceptor drum 1030 is electrically attracted by the recording sheet 1040. The toner image on the surface of the photoreceptor drum 1030 is thus transferred to the recording sheet 1040. The recording sheet 1040 having the transferred toner image is transferred to a fixing roller 1041.

The recording sheet 1040 on the fixing roller 1041 has heat and pressure applied so that the toner image is fixed on the recording sheet 1040. The recording sheet 1040 having the fixed toner image is transferred to a paper receiving tray 1043 via a roller pair 1042 and sequentially stacked on the paper receiving tray 1043.

The static eliminator unit 1034 is configured to neutralize (discharge) the surface of the photoreceptor drum 1030.

The cleaning unit 1035 is configured to remove remaining toner from the surface of the photoreceptor drum 1030. The position of the surface of the photoreceptor drum 1030 from which the remaining toner is removed returns to a position that faces the electrostatic charger 1031.

Next, the configuration of the optical scanner device 1010 is described.

As illustrated in FIG. 2, the optical scanner device 1010 includes a deflector-side scanning lens 11a, an image surface-side scanning lens 11b, a polygon mirror 13, a light source 14, a coupling lens 15, an aperture plate 16, a cylindrical lens 17, a reflecting mirror 18, and a scanning controller (not shown). These components of the optical scanner device 1010 are arranged in corresponding predetermined positions inside an optical housing 30.

Note that a direction corresponding to a main-scanning direction is hereinafter called a "corresponding main-scanning direction", and a direction corresponding to a sub-scanning direction is called a "corresponding sub-scanning direction" for convenience.

Further, the coupling lens 15 is provided to convert the luminous flux emitted from the light source 14 into approximately parallel light.

The aperture plate 16 having an aperture is provided to regulate a beam diameter of the luminous flux received via the coupling lens 15.

A cylindrical lens 17 is provided to form an image near a deflection reflecting surface in the corresponding sub-scanning direction with the luminous flux passing through the aperture of the aperture plate 16.

Further, an optical system provided in an optical path between the light source 14 and the polygon mirror 13 may also be called a deflector-side optical system. The deflector-side optical system according to the embodiment includes the coupling lens 15, the aperture plate 16, the cylindrical lens 17, and a reflecting mirror 18.

An example of the polygon mirror 13 has a hexahedral mirror having an inscribed circle with a radius of 18 mm, and respective portions of the hexahedral mirror function as the deflection reflecting surfaces. The polygon mirror 13 rotates at a constant velocity around a shaft arranged in parallel with the corresponding sub-scanning direction.

The deflector-side scanning lens 11a is arranged in an optical path of the luminous flux deflected by the polygon mirror 13.

The image surface-side scanning lens 11b is arranged in the optical path of the luminous flux via the deflector-side scanning lens 11a. The luminous flux via the image surface-side scanning lens 11b is applied on the surface of the photoreceptor drum 1030 to form an optical spot. The optical spot travels with the rotation of the polygon mirror 13 in a longitudinal direction of the photoreceptor drum 1030. That is, the optical spot scans the surface of the photoreceptor drum 1030. The scanning direction of the optical spot is the "main-scanning direction". Further, the rotational direction of the photoreceptor drum 1030 is the "sub-scanning direction".

An optical system provided in an optical path between the polygon mirror 13 and the photoreceptor drum 1030 may also be called a "scanning optical system". The scanning optical system in this embodiment includes the deflector-side scanning lens 11a and the image surface-side scanning lens 11b. Note that at least one folded mirror may be arranged in at least one of the optical path between the deflector-side scanning lens 11a and the image surface-side scanning lens 11b and the optical path between the image surface-side scanning lens 11b and the photoreceptor drum 1030.

Figure 3A:
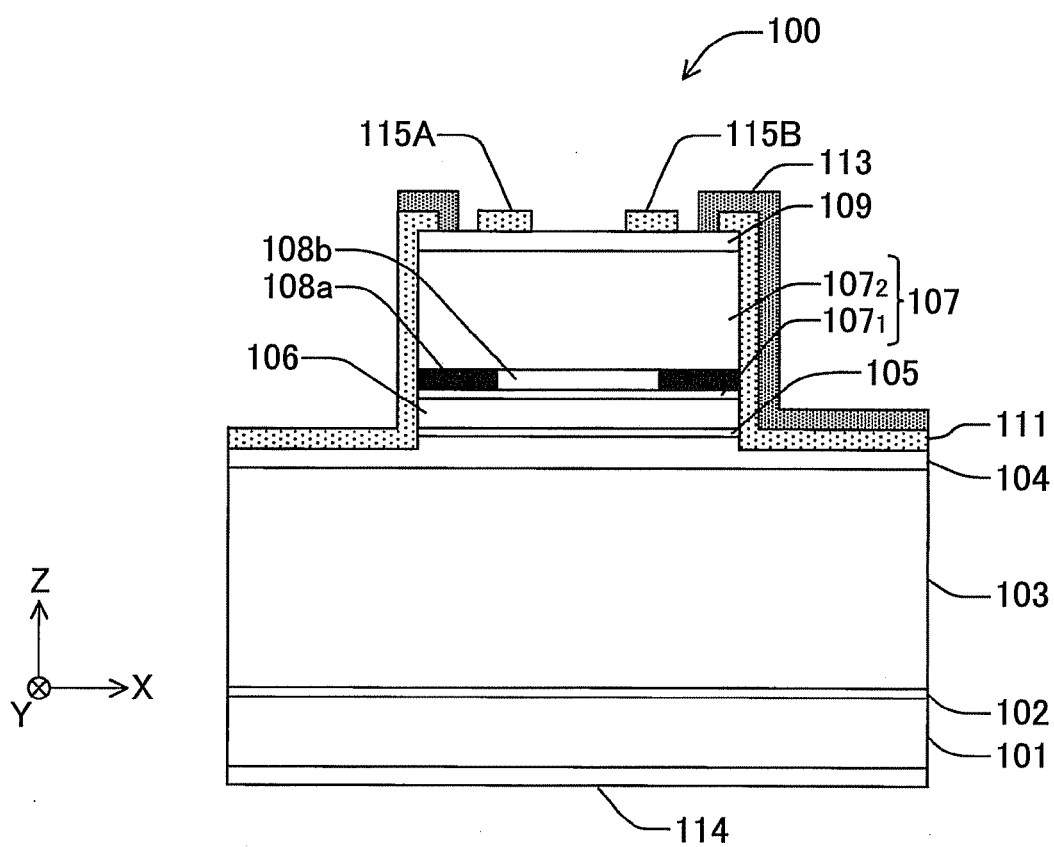
FIGS. 3A and 3B are diagrams illustrating a surface-emitting laser element provided contained in a light source used in the optical scanner device in FIG. 2.
Figure 3B:
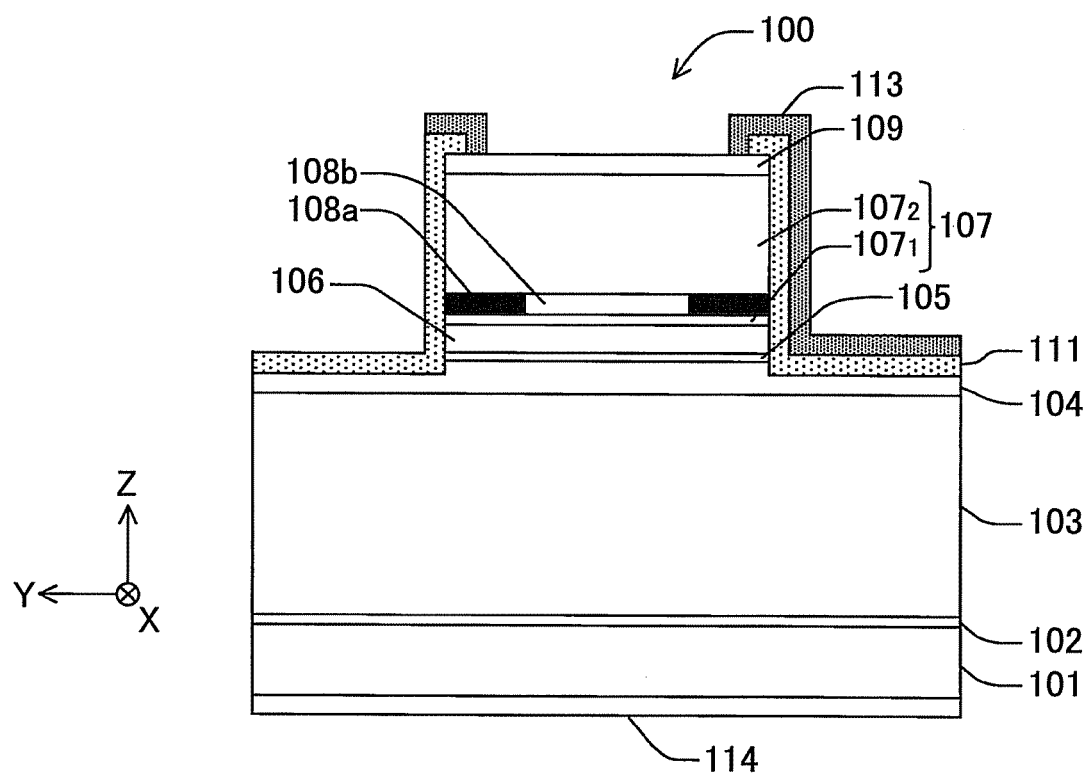

The light source 14 may include a surface-emitting laser element 100 illustrated in FIGS. 3A and 3B. In this specification, a Z-axis direction is defined as a laser oscillation direction, and X-axis and Y-axis directions are defined as two mutually orthogonal directions perpendicular to the Z-axis direction in a surface. Note that FIG. 3A is a cross-sectional diagram illustrating the surface-emitting laser element 100 in the X-Z plane, and FIG. 3B is a cross-sectional diagram illustrating the surface-emitting laser element 100 sectioned in the Y-Z plane.

The surface-emitting laser element 100 has a wavelength band of 780 nm, and is configured to include a substrate 101, a buffer layer 102, a lower semiconductor DBR 103, a lower spacer layer 104, an active layer 105, an upper spacer layer 106, an upper semiconductor DBR 107, a contact layer 109, a p-side electrode 113, an n-side electrode 114, and two mode filters 115A and 115B.

Figure 4A:
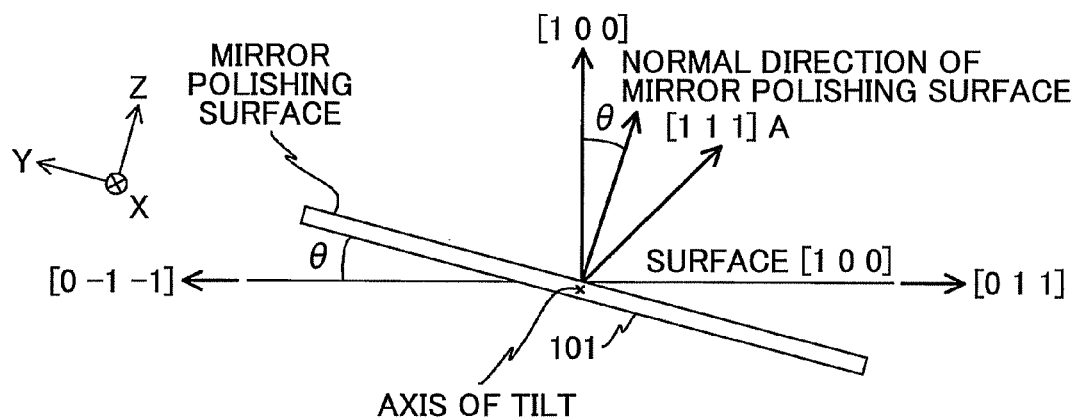
FIGS. 4A and 4B are diagrams illustrating a substrate of the surface-emitting laser element in FIGS. 3A and 3B.
Figure 4B:
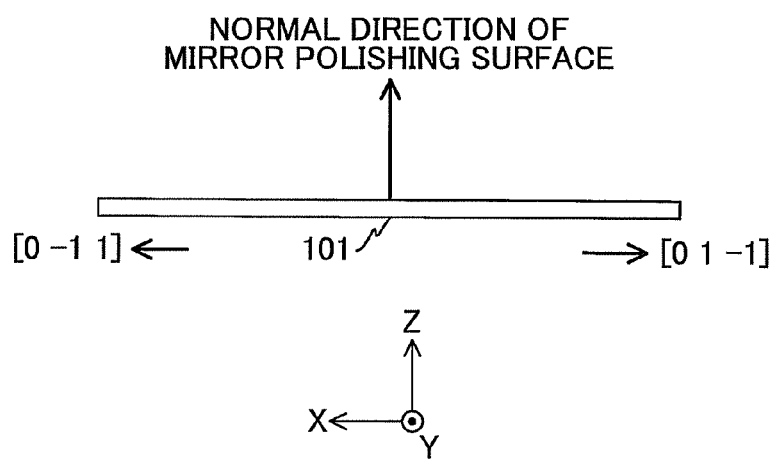

As illustrated in FIG. 4A, an upper surface of the substrate 101 has a mirror polishing surface (a main surface). The substrate 101 is an n-GaAs mono-crystal substrate and its normal direction is slanted at 15 degrees ($\theta$=15) toward a crystal orientation [1 1 1]A direction from a crystal orientation [1 0 0] direction. That is, the substrate 101 is a slanted substrate. As illustrated in FIG. 4B, the substrate 101 is arranged such that the crystal orientation [0 −1 1] direction of the substrate 101 is a +X direction and the crystal orientation [0 1 −1] direction of the substrate 101 is a −X direction.

Referring back to FIG. 3A, the buffer layer 102 is formed of an n-GaAs layer and stacked on a surface of the substrate 101 in a +Z direction.

The lower semiconductor DBR 103 is stacked on a surface of the buffer layer 102 in the +Z direction. The lower semiconductor DBR 103 has 40.5 pairs of refractive index layers each having a low refractive index layer made of n-AlAs and a high refractive index layer made of n-$Al_{0.3}Ga_{0.7}As$. A composition gradient layer having a thickness of 20 nm is provided between the low refractive index layer and the high refractive index layer for reducing electric resistance. The composition gradient layer has a gradual compositional change from one composition to the other. Each of the low refractive index layer and the high refractive index layer is arranged such that it includes half of the adjacent composition gradient layer and an optical thickness of $\lambda/4$ based on the oscillation wavelength of $\lambda$. Note that if the optical thickness is $\lambda/4$, the actual thickness D of the corresponding layer is $D=\lambda/4n$ where n represents a refractive index of a medium of that layer.

The lower spacer layer 104 is stacked on a surface of the lower semiconductor DBR 103 in the +Z direction. The lower spacer layer 104 is formed of a non-doped layer made of $(Al_{0.1}Ga_{0.9})_{0.5}In_{0.5}P$.

The active layer 105 is stacked on a surface of the lower spacer layer 104 in the +Z direction and has a GaInAsP/GaInP triple quantum well structure. Each of the quantum well layers includes a composition of GaInAsP that induces 0.7% compression strain and each of barrier layers includes a composition of GaInP that induces 0.6% stretching strain.

The upper spacer layer 106 is stacked on a surface of the active layer 105 in the +Z direction. The upper spacer layer 106 is formed of a non-doped layer made of $(Al_{0.1}Ga_{0.9})_{0.5}In_{0.5}P$.

A portion including the lower spacer layer 104, the active layer 105, and the upper spacer layer 106 is called a resonator structure and includes an optical thickness of 1 wavelength. The active layer 105 is provided at the center of the resonator structure located at an anti-node of a standing wave distribution of the electric field so as to obtain a high stimulated emission probability.

The upper semiconductor DBR 107 includes a first upper semiconductor DBR 1071 and a second upper semiconductor DBR 1072.

The first upper semiconductor DBR 1071 is stacked on a surface of the upper spacer layer 106 in the +Z direction. The first upper semiconductor DBR 1071 has a pair of a low refractive index layer made of p-$(Al_{0.7}Ga_{0.3})_{0.5}In_{0.5}P$ and a high refractive index layer made of p-$(Al_{0.1}Ga_{0.9})_{0.5}In_{0.5}P$. A composition gradient layer is provided between the low refractive index layer and high refractive index layer for reducing electric resistance. The composition gradient layer has a gradual compositional change from one composition to the other. Each of the low refractive index layer and the high refractive index layer is arranged such that it includes half of the adjacent composition gradient layer and has an optical thickness of $\lambda/4$.

The second upper semiconductor DBR 1072 is stacked on a surface of the first upper semiconductor DBR 1071 in the +Z direction. The second upper semiconductor DBR 1072 has 23 pairs of a low refractive index layer made of p-$Al_{0.9}Ga_{0.1}As$ and a high refractive index layer made of p-$Al_{0.3}Ga_{0.7}As$. A composition gradient layer is provided between the low refractive index layer and high refractive index layer for reducing electric resistance. The composition gradient layer has a gradual compositional change from one composition to the other. Each of the low refractive index layer and the high refractive index layer is arranged such that it includes half of the adjacent composition gradient layer and has an optical thickness of $\lambda/4$.

A selective oxidation layer 108 (see FIG. 5A) made of p-AlAs and having a thickness of 30 nm is inserted in one of the low refractive index layers of the second upper semiconductor DBR 1072. The selective oxidation layer 108 includes, upon oxidation, an oxidized region 108*a* and a non-oxidized region 108*b*.

The inserted position of the selective oxidation layer 108 is a third wave node from the active layer 105 in the standing wave distribution of the electric field.

The contact layer 109 is stacked on a surface of the upper semiconductor DBR 107 in the +Z direction and is made of p-GaAs.

The mode filters 115A and 115B are provided on a surface of the contact layer 109 in the +Z direction. The mode filters 115A and 115B are made of dielectric films and located in a peripheral portion within an emission region and outside the central portion of the emission region to make the reflectance of that region (i.e., the peripheral portion within the emission region) where mode filters 115A and 115B are provided lower than the central portion of the emission region.

Next, a method for fabricating the surface-emitting laser element 100 is briefly described. Note that a product obtained by stacking plural semiconductor layers on the substrate 101 is simply called a "stacked product".

Figure 5A:
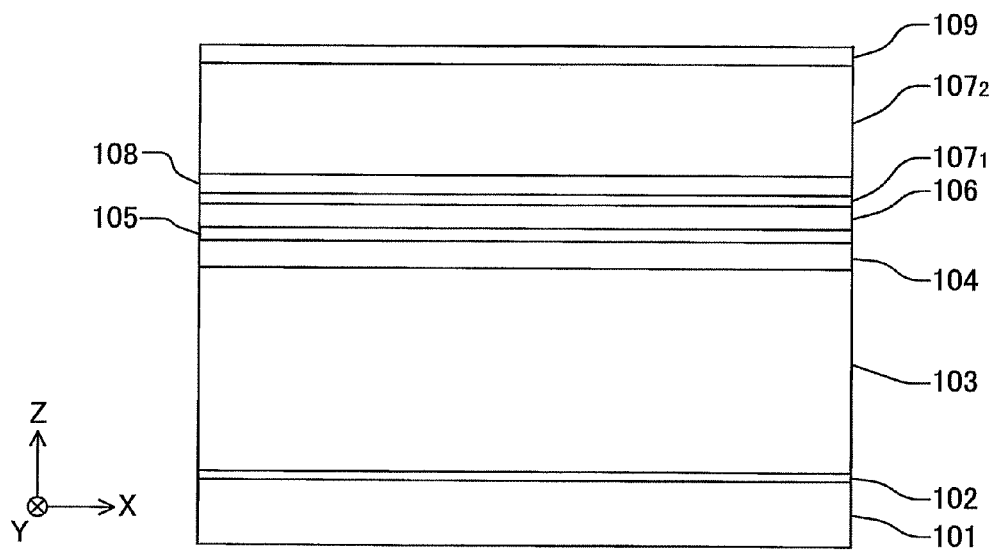
FIGS. 5A and 5B are first example diagrams illustrating a method for fabricating the surface-emitting laser element.

(Step S1) The above stacked product is obtained by crystal growth by metal organic chemical vapor deposition (MOCVD) or molecular beam epitaxy (MBE) as illustrated in FIG. 5A.

In the crystal growth by MOCVD, trimethylaluminum, trimethylgallium (TMG), and trimethylindium (TMI) are used as raw materials for III-Group, and phosphine ($PH_3$) and arsine ($AsH_3$) are used as raw materials for V-Group. In addition, carbon tetrabromide ($CBr_4$) and dimethylzinc (DMZn) are used as p-type dopant materials, and hydrogen selenide ($H_2Se$) is used as an n-type dopant material.

(Step S2) A quadrilateral resist pattern is formed on the surface of the stacked product. In this example, the quadrilateral resist pattern has a length of 25.3 µm in an X-axis direction, and a length of 24.7 µm in a Y-axis direction.

(Step S3) A mesa structure (hereinafter simply called a "mesa" for convenience) having a quadrilateral pillar is formed using the above resist pattern as photo masks by an ECR etching using a Cl2 gas. A bottom surface of the etching is located in a middle of the lower spacer layer 104.

Figure 5B:
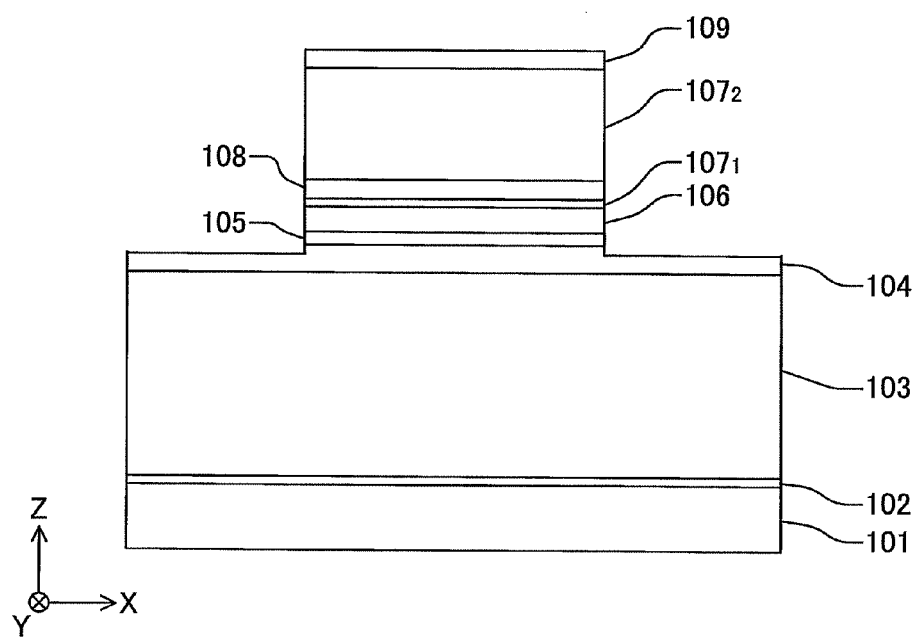

(Step S4) The photo mask is removed as illustrated in FIG. 5B.

Figure 6A:
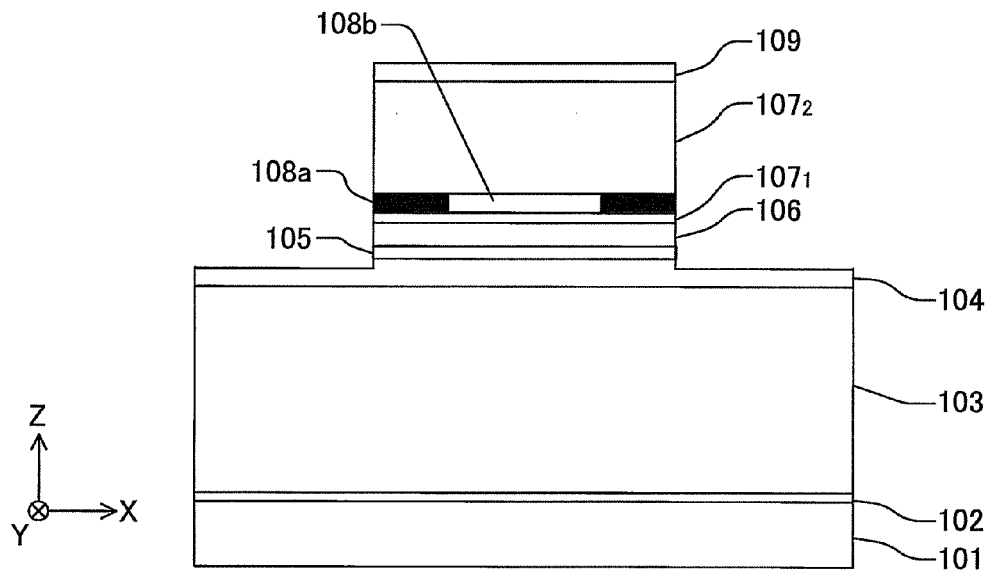
FIGS. 6A and 6B are second example diagrams illustrating a method for fabricating the surface-emitting laser element.

(Step S5) The resulting stacked product is heat treated under water evaporation. With the heat treatment under the water evaporation, aluminum (Al) of the selective oxidation layer is selectively oxidized from its outer periphery so that a non-oxidized region 108*b* encircled by the Al oxide product 108*a* remains at the center of the mesa as illustrated in FIG. 6A. That is, an oxide confined structure is formed to restrict a path for allowing the drive current of the light-emitting portion to pass through to a central portion of the mesa. The non-oxidized region 108*b* is the current passage region (current injection region). The quadrilateral current passage region is thus formed. In this example, the quadrilateral current passage region has a length of 4.4 µm in an X-axis direction, and a length of 4.0 µm in a Y-axis direction.

Figure 6B:
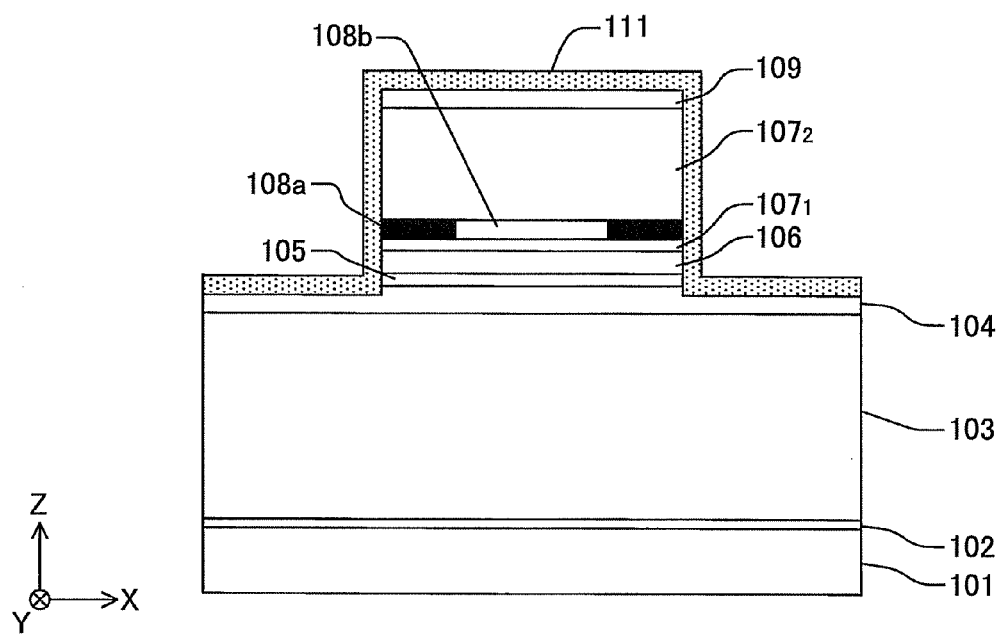

(Step S6) A protection layer 111 made of SiN is formed over the entire surface of the stacked product by chemical vapor deposition (CVD) as illustrated in FIG. 6B. In this example, the protection layer 111 has an optical thickness of $\lambda/4$. Specifically, since a refractive index n of SiN is 1.86 and an oscillation wavelength $\lambda$ of SiN is 780 nm, the actual film thickness ($=\lambda/4$ n) of the protection layer 111 is determined as approximately 105 nm.

Figure 7:
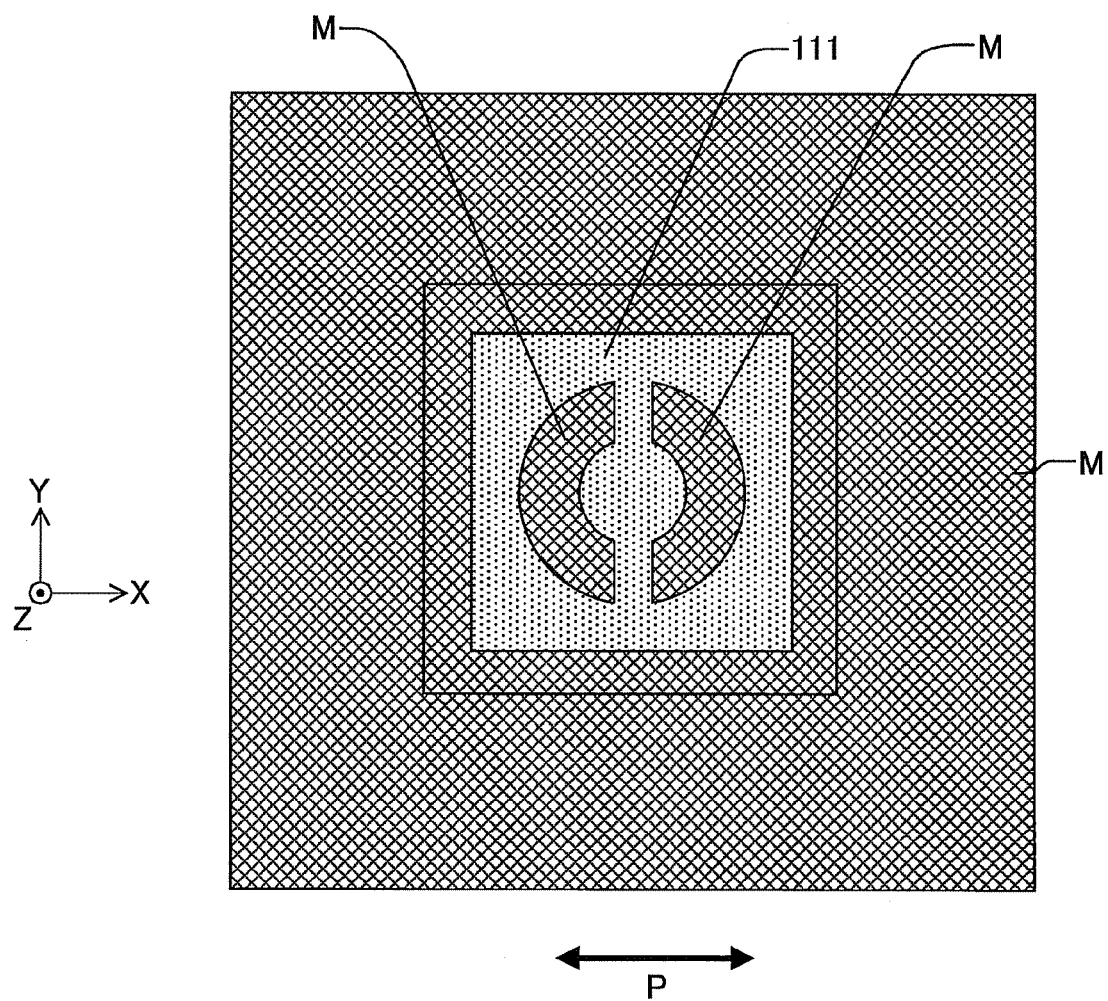
FIG. 7 is a third example diagram illustrating a method for fabricating the surface-emitting laser element.

(Step S7) Etching masks (i.e., masks M) for forming an opening for the p-side electrode contact are formed on an upper side of the mesa that is an emission surface of the laser beam. As illustrated in the mesa portion of FIG. 7 and an enlarged mesa portion in FIG. 8, masks M are formed in the peripheral portion of the mesa, the peripheral portion of the upper surface of the mesa, and the two sub-regions in the upper surface of the mesa; that is, a first sub-region and a second sub-region mutually facing and sandwiching the central portion of the upper surface of the mesa in a direction in parallel with a desired polarization direction P (i.e., the X-axis direction in this case) such that these portions are not etched. Specifically, reference numerals L1, L2, and c in FIG. 8 are 4.5 µm, 4 µm, and 2.1 µm, respectively. The two sub-regions (first and second sub-regions) are obtained by dividing a circular shape having an outer diameter of (L1+2*L2) and an inner diameter of L1 by a line having a width c passing through the center of the circular shape in parallel with the Y-axis direction in FIG. 8.

(Step S8) The protection layer 111 is etched by buffered Hydrofluoric Acid (BHF) such that the protection layer 111 has an opening for the p-side electrode contact.

Figure 9A:
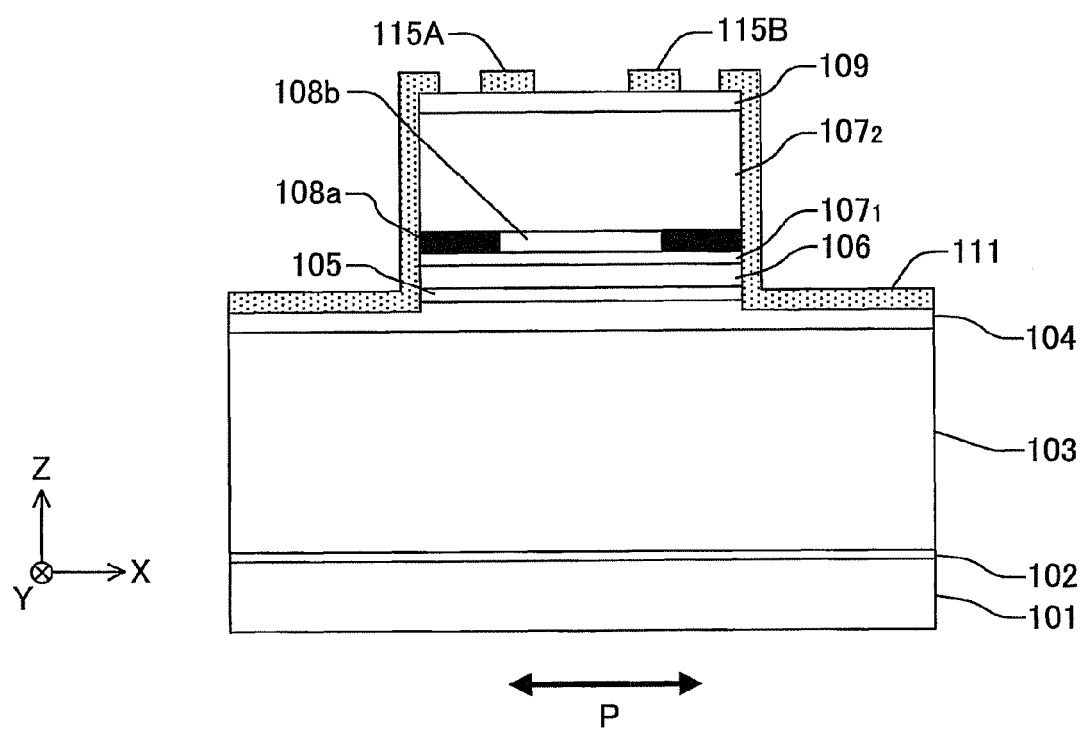
FIGS. 9A and 9B are fourth example diagrams illustrating a method for fabricating the surface-emitting laser element.
Figure 9B:
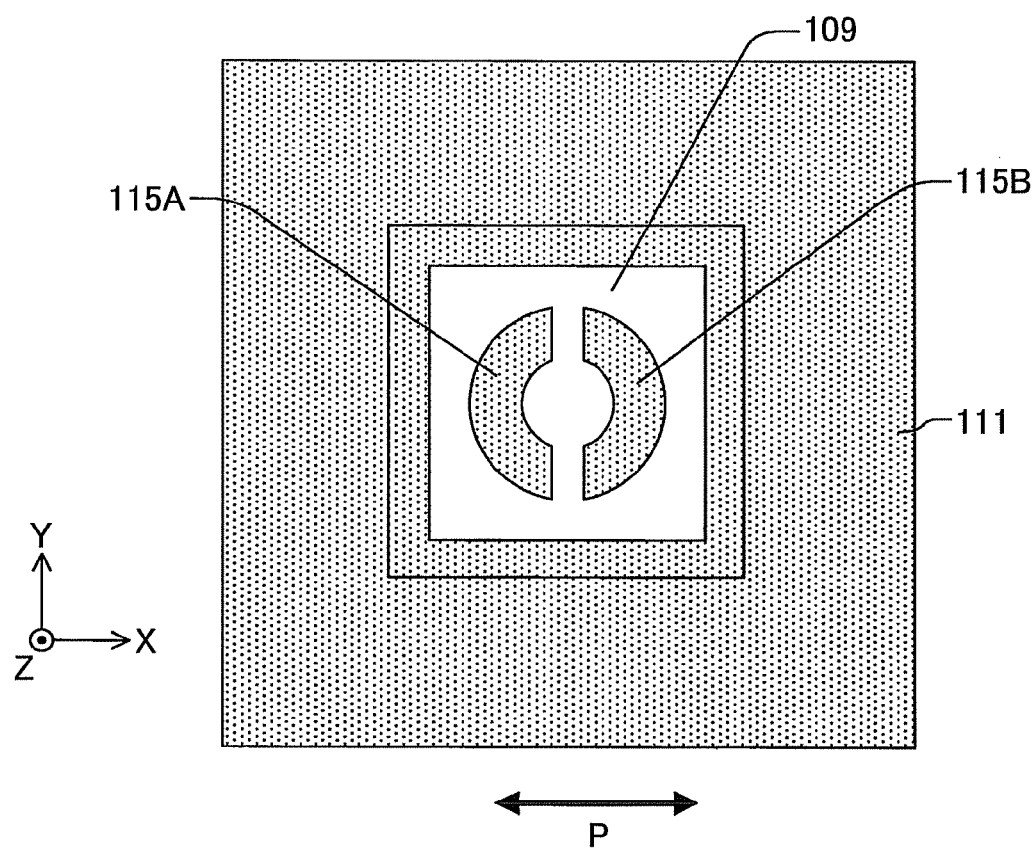

(Step S9) The masks M are then removed as illustrated in FIGS. 9A and 9B. Thus, a remaining portion of the protection layer 111 in the first sub-region forms the mode filter 115A, and a remaining portion of the protection layer 11 in the second sub-region forms the mode filter 115B.

Note that in this example, a method for forming the mode filters includes forming masks having desired shapes for etching above the SiN film on the entire surface by chemical vapor deposition (CVD) to remove undesired portions of SiN film. However, the method is not so limited. For example, a lift off method may be employed instead, where a resist pattern may be formed in advance, SiN film is formed by CVD, and undesired portions of the resist pattern are then removed.

(Step S10) A square resist pattern having 14 µm on a side is formed in a region corresponding to the light-emitting portion corresponding to the upper side of the mesa to deposit p-side electrode material. The p-side electrode material may become a multilayer film of Cr/AuZn/Au or a multilayer film of Ti/Pt/Au.

Figure 10:
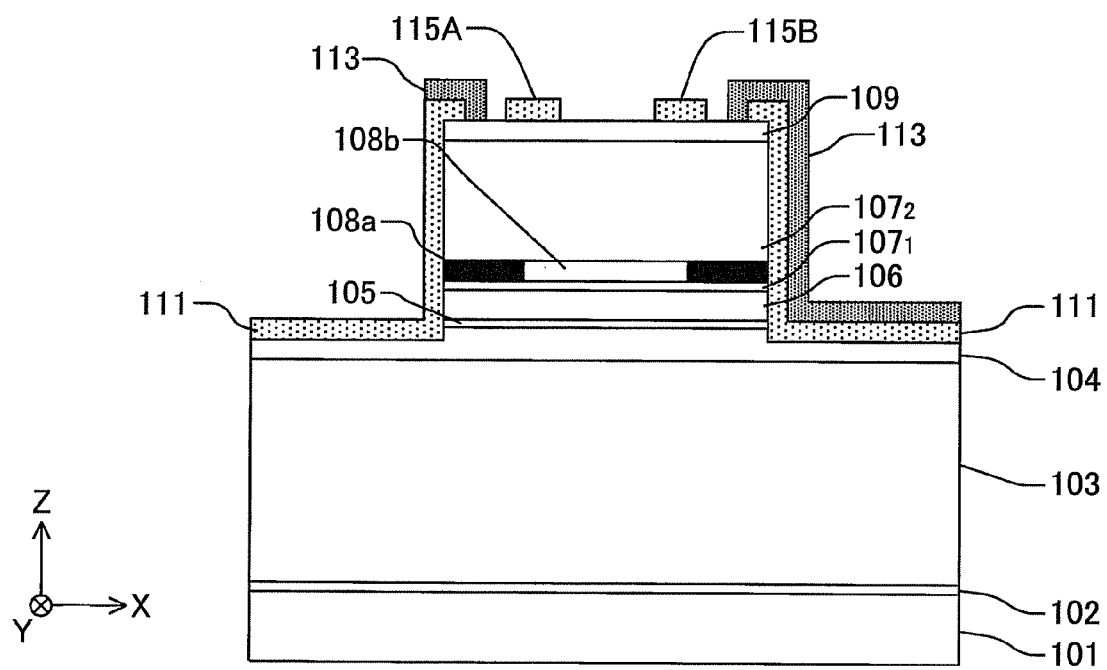
FIG. 10 is a fifth example diagram illustrating a method for fabricating the surface-emitting laser element.
Figure 11:
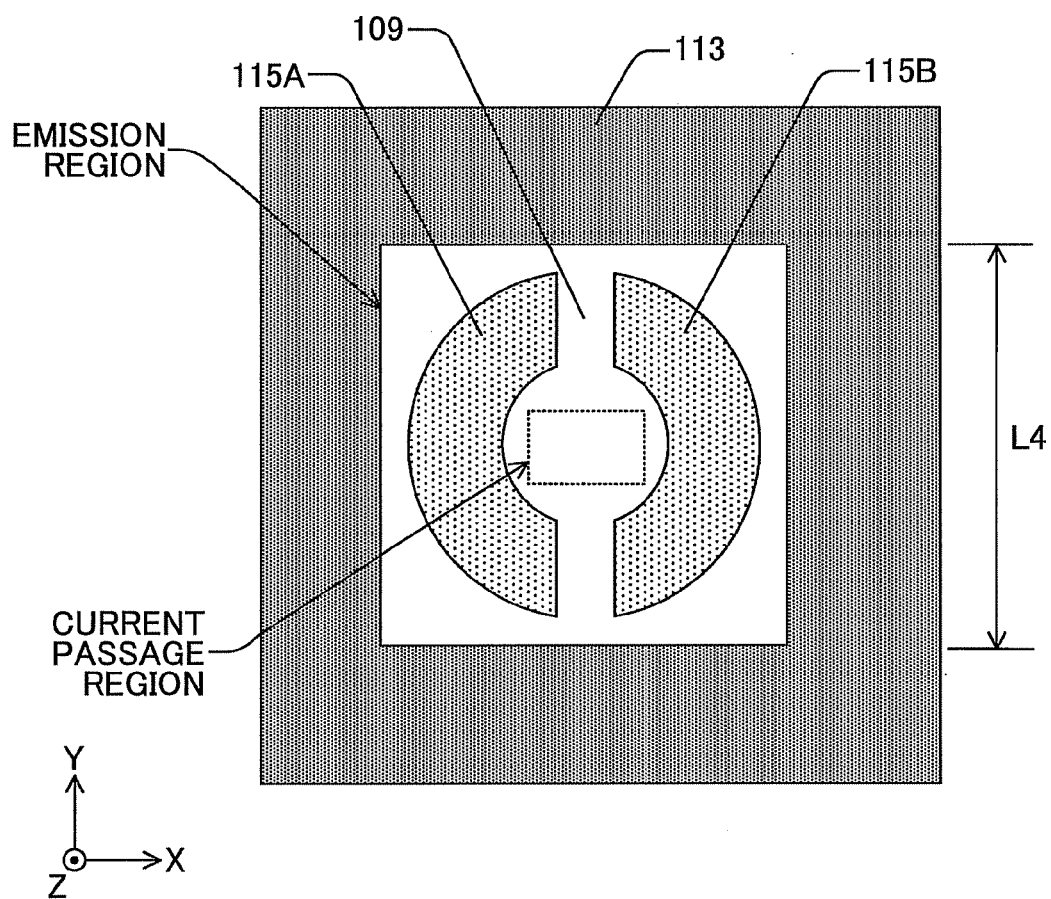
FIG. 11 is an enlarged diagram illustrating an upper surface of a mesa structure cut out of the surface-emitting laser element illustrated in FIG. 10.

(Step S11) The electrode material deposited in the region (emission region) corresponding to the light-emitting portion is lifted off to form the p-side electrode 113 as illustrated in FIG. 10. The region enclosed by the p-side electrode 113 is the emission region. Note that FIG. 11 is an enlarged diagram illustrating the mesa cut out of the mesa structure illustrated in FIG. 10. The emission region has a square shape having a length L4 (14 μm in this case) on a side. In this embodiment, the mode filters 115A and 115B are formed as the dielectric films made of SiN and having an optical thickness of λ/4 in the two sub-regions (first and second regions) in the emission region. Accordingly, the reflectance of the two sub-regions (first and second sub-regions) are lower than the reflectance of the central portion of the emission region.

Figure 12:
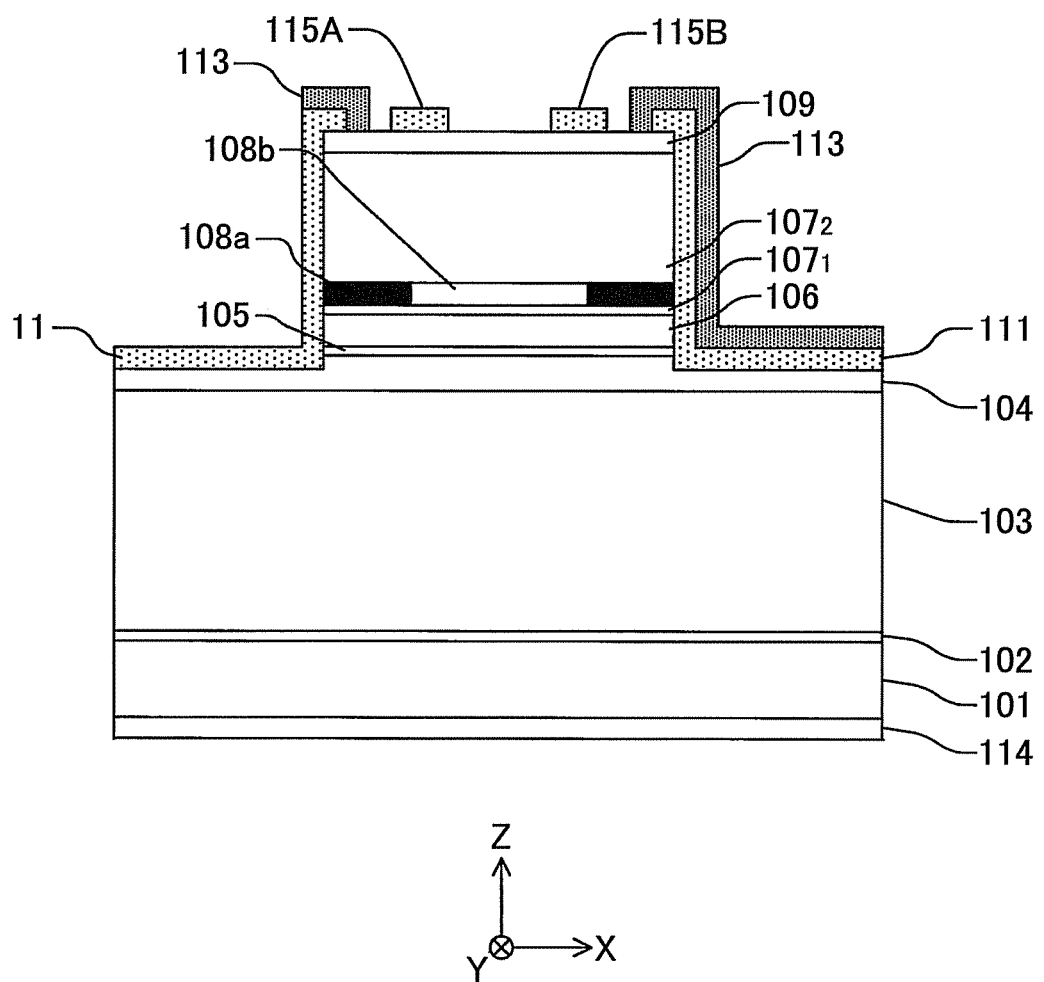
FIG. 12 is a sixth example diagram illustrating a method for fabricating the surface-emitting laser element.

(Step S12) The backside of the substrate 101 is polished in a predetermined thickness (e.g., 100 μm), and the n-side electrode 114 is formed on a polished backside surface of the substrate 101 as illustrated in FIG. 12. In this example, the n-side electrode 114 is made of a multilayer film of AuGe/Ni/Au.

(Step S13) The ohmic conductivity of the p-side electrode 113 and the n-side electrode 114 is obtained by annealing. Thus, the mesa is formed as the light-emitting portion.

(Step S14) The obtained product is then cut per chip, thereby fabricating surface-emitting laser elements.

Figure 13:
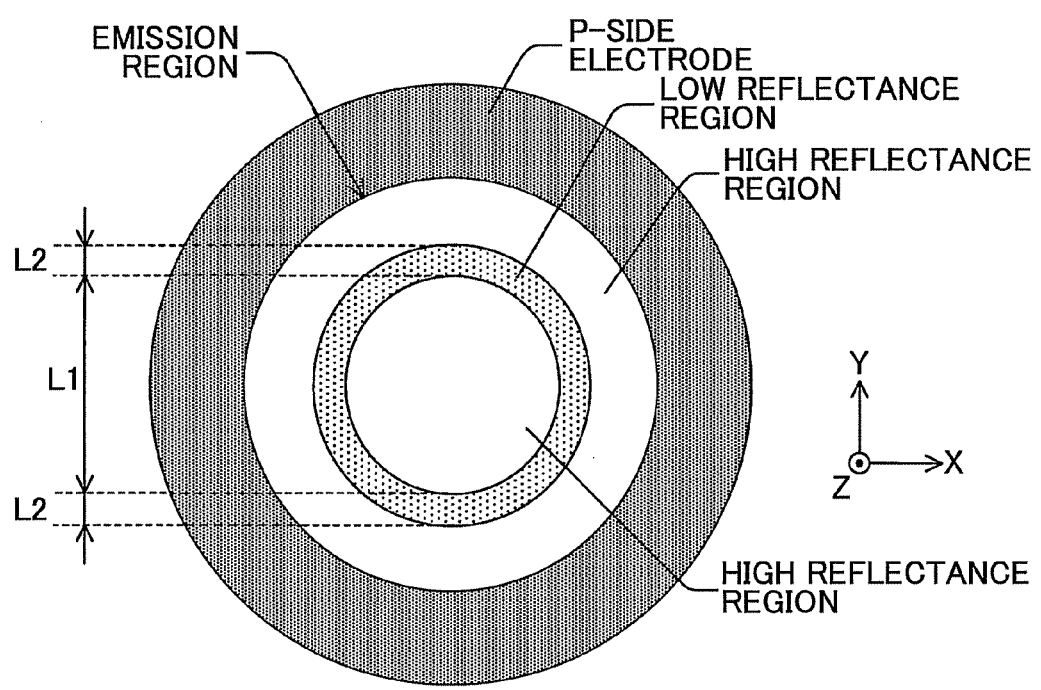
FIG. 13 is a diagram illustrating an example of the surface-emitting laser element used in computing oscillation distribution.

As illustrated in FIG. 13, a surface-emitting laser element (a computational model) is formed by stacking plural semiconductors in a similar manner as the surface-emitting laser element 100, forming one ring-shaped sub-region enclosing a central portion of the circular emission region, and forming a dielectric film having an optical thickness of λ/4. In the surface-emitting laser element, an oscillation mode distribution is computed based on a fixed width L2 of the sub-region of 3 μm, and a variable inner diameter L1 of the sub-region. Note that a diameter of the current passage region is computed as 4.5 μm.

Figure 14:
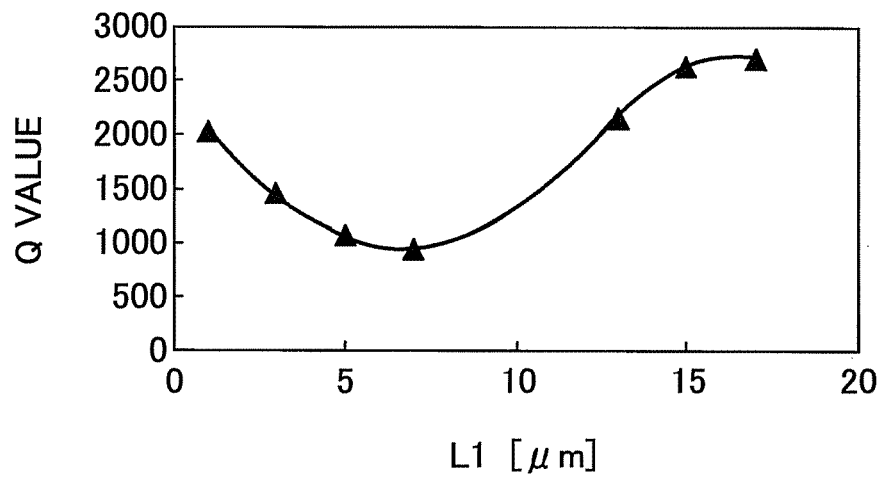
FIG. 14 is a graph illustrating a relationship between an inner diameter L1 of a sub-region and a Q value in a high-order oscillation transverse mode of a laser beam.

FIG. 14 is a graph illustrating a relationship between the inner diameter L1 of the sub-region and a Q value in a high-order transverse mode of a laser beam, which is obtained by the above computational result. Note that Q value is a non-dimensional parameter indicating performance of the resonator in each mode, and inversely proportional to the oscillation wavelength and a dissipation factor of the resonator. That is, if the oscillation wavelength is $\lambda$ [m] and the dissipation factor of the resonator is $\alpha$ [1/m], $Q \propto 1/\lambda\alpha$ is obtained. Note that since the oscillation wavelength $\lambda$ is constant, Q value is determined based on the dissipation factor of the resonator $\alpha$. Thus, the greater the Q value in each mode is, the smaller is the dissipation factor of the resonator $\alpha$, thereby easily oscillating the corresponding mode of a laser beam.

If L1 is set in a range of 4 to 9 μm, the Q value of the high-order transverse mode of a laser beam may be significantly lowered. The Q value is associated with a value of the optical confinement in a vertical direction, so that the greater the Q value of the optical confinement is, the smaller is the threshold current. Accordingly, if L1 is in the above range of 4 to 9 μm, a distribution of the high-order transverse mode of a laser beam overlaps with the low reflectance region, thereby suppressing the oscillation of the high-order transverse mode of a laser beam. If, on the other hand, L1 is outside of the above range of 4 to 9 μm, the Q value is raised, thereby inducing the oscillation of the high-order transverse mode of a laser beam easily.

Figure 15:
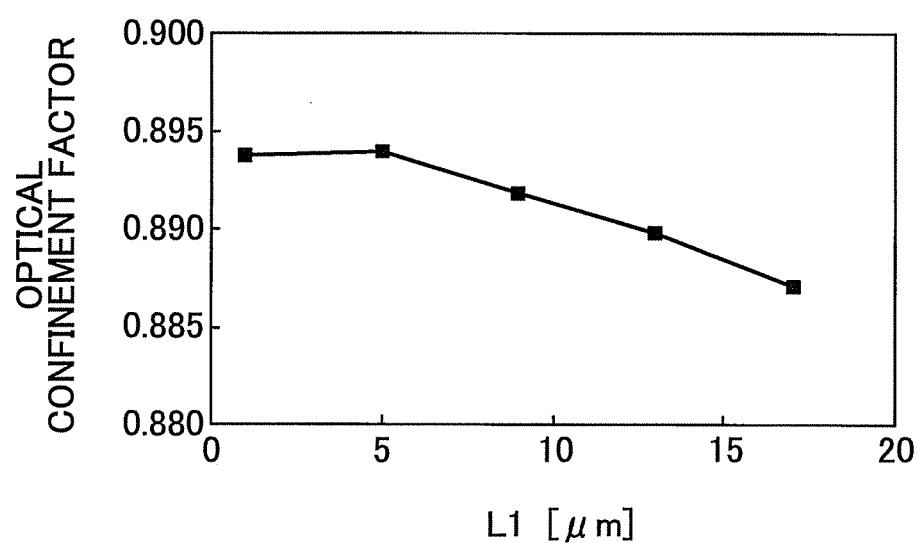
FIG. 15 is a graph illustrating a relationship between an inner diameter L1 of the sub-region and an optical confinement factor in a transverse direction of a single transverse mode of a laser beam.

FIG. 15 is a graph illustrating a relationship between the inner diameter L1 of the sub-region and the optical confinement factor in the transverse direction of the single transverse mode of a laser beam. The effect of the optical confinement increases with the reduction of the inner diameter L1 of the sub-region, and the highest effect of the optical confinement may be obtained when the inner diameter L1 of the sub-region is approximately 5 μm. This result is obtained when the configuration of the sub-region is centrosymmetric and isotropic. However, if the sub-region is anisotropic in two orthogonal directions, the effect of the optical confinement may differ in two orthogonal directions. The polarization component in a direction having a high optical confinement effect may more easily be oscillated than that the polarization component in a direction having a low optical confinement effect, thereby controlling the polarization direction in a direction having the high optical confinement effect.

Accordingly, in the surface-emitting laser element 100 fabricated in the above method, the polarization direction is directed in the X-axis direction while the oscillation of the high-order transverse mode of a laser beam is suppressed.

The rectangularity of the current passage region is defined by Ly/Lx where a length Lx represents the X-axis direction of the current passage region and a length Ly represents the Y-axis direction of the current passage region, and temporal change in the effect of the rectangularity of the current passage region on optical variation in the high-order transverse mode of a laser beam is examined.

In order to examine the above effect, plural surface-emitting laser elements were prepared by varying the rectangularity of the current passage region of each surface-emitting laser element as the parameter, and an acceleration test was conducted on each of the surface-emitting laser element. In the acceleration test, the surface-emitting laser elements with various rectangularity of the current passage region were continuously oscillated at 1.4 mW under 80° C. until the drive current is raised by 3%.

Figure 16:
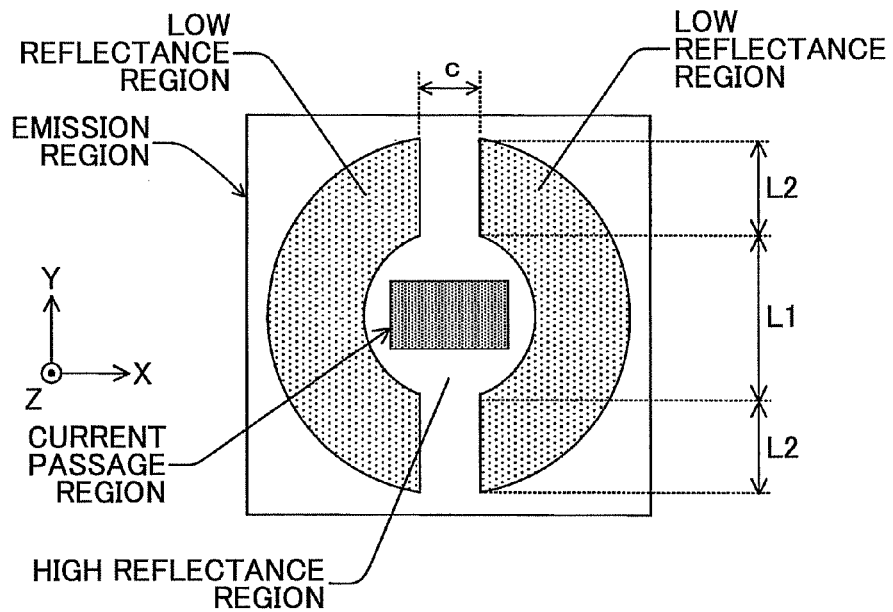
FIG. 16 is a diagram illustrating a configuration of the surface-emitting laser element when the rectangularity of a current passage region is less than 1.
Figure 17:
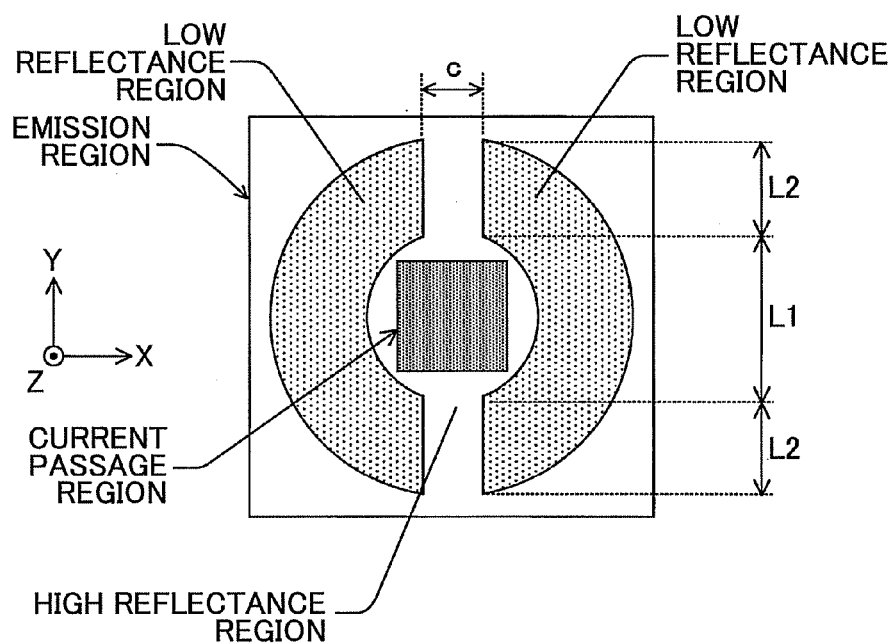
FIG. 17 is a diagram illustrating a configuration of the surface-emitting laser element when the rectangularity of a current passage region equals 1.
Figure 18:
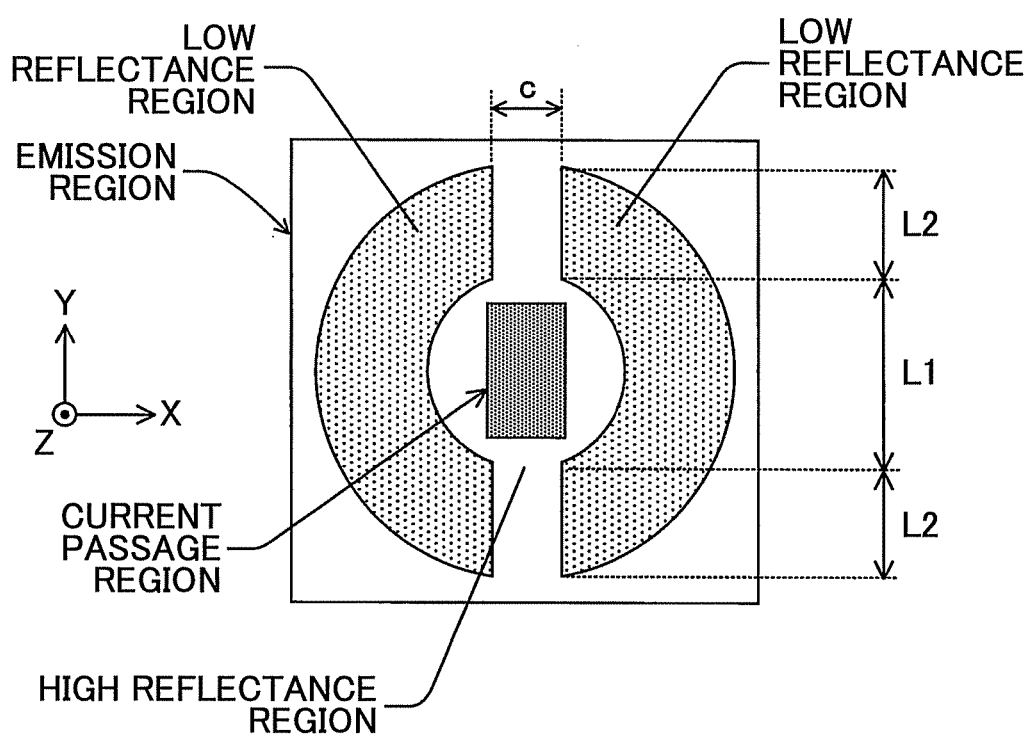
FIG. 18 is a diagram illustrating a configuration of the surface-emitting laser element when the rectangularity of a current passage region is greater than 1.

FIG. 16 illustrates an example of a positional relationship between the current passage region and the low reflectance region when the rectangularity of the current passage region is less than 1. FIG. 17 illustrates an example of a positional relationship between the current passage region and the low reflectance region when the rectangularity of the current passage region is 1. Further, FIG. 18 illustrates an example of a positional relationship between the current passage region and the low reflectance region when the rectangularity of the current passage region greater than 1. Note that all the surface-emitting laser elements used in the acceleration test have L1=4.5 μm, L2, =4 μm, and c=1.6 μm. Further, Lx and Ly were set such that the current passage areas of the surface-emitting laser elements used in the acceleration test were approximately the same.

FIG. 19 illustrates a table containing Lx and Ly, the current passage area, measured value of the rectangularity of the current passage area, a single mode output before the acceleration test, a single mode output after the acceleration test, and a change ratio in the single mode output before and after the acceleration test with the above surface-emitting laser elements. In the examination, an optical output value where an output ratio SMSR (Side Mode Suppression Ratio) of the single transverse mode of a laser beam to the high-order transverse mode of a laser beam was 20 dB was used as the single mode output.

Figure 20:
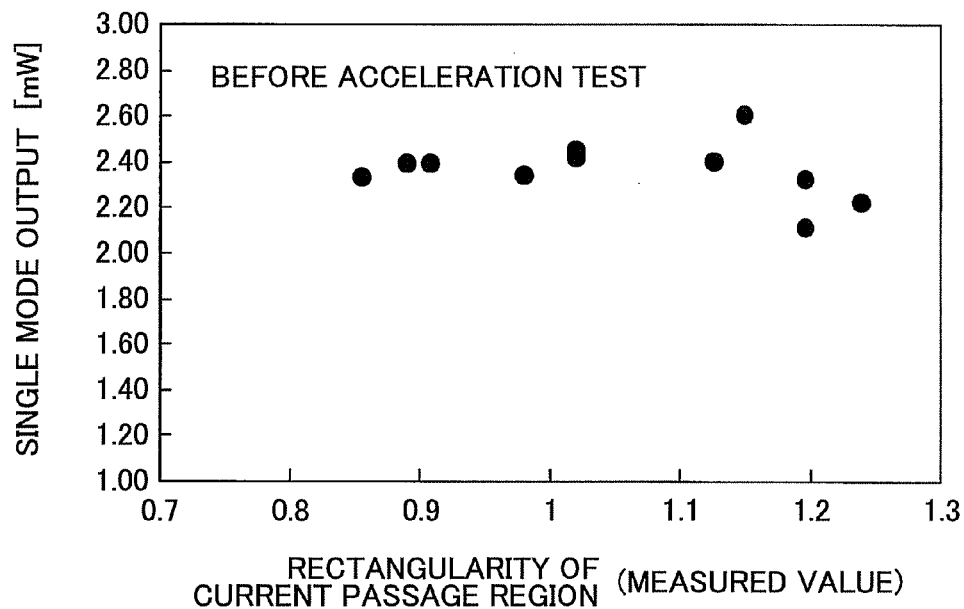
FIG. 20 is a graph illustrating a relationship between a single mode output and the rectangularity of the current passage region before the acceleration test.
Figure 21:
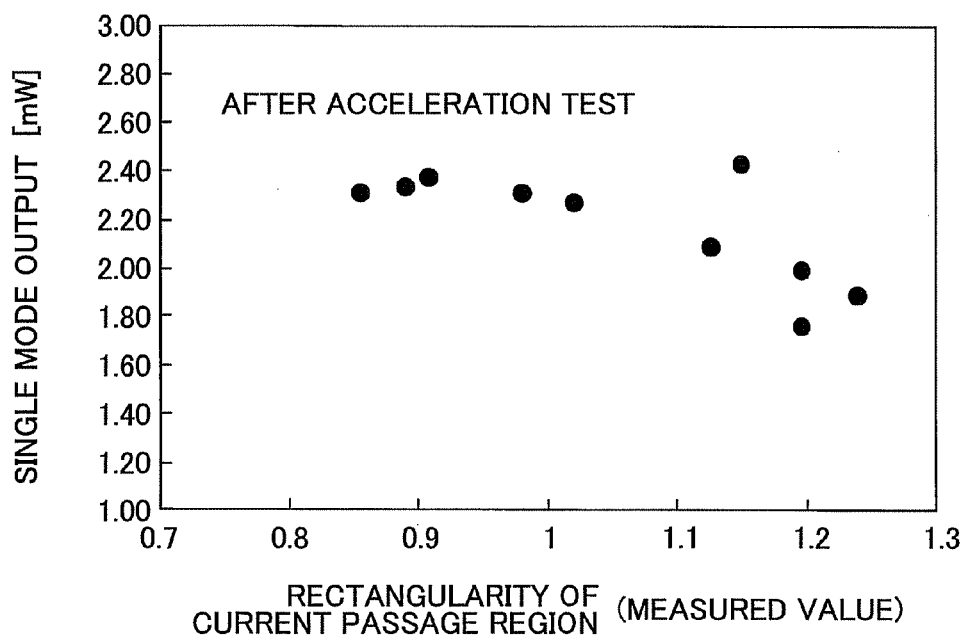
FIG. 21 is a graph illustrating a relationship between a single mode output and the rectangularity of the current passage region after the acceleration test.
Figure 22:
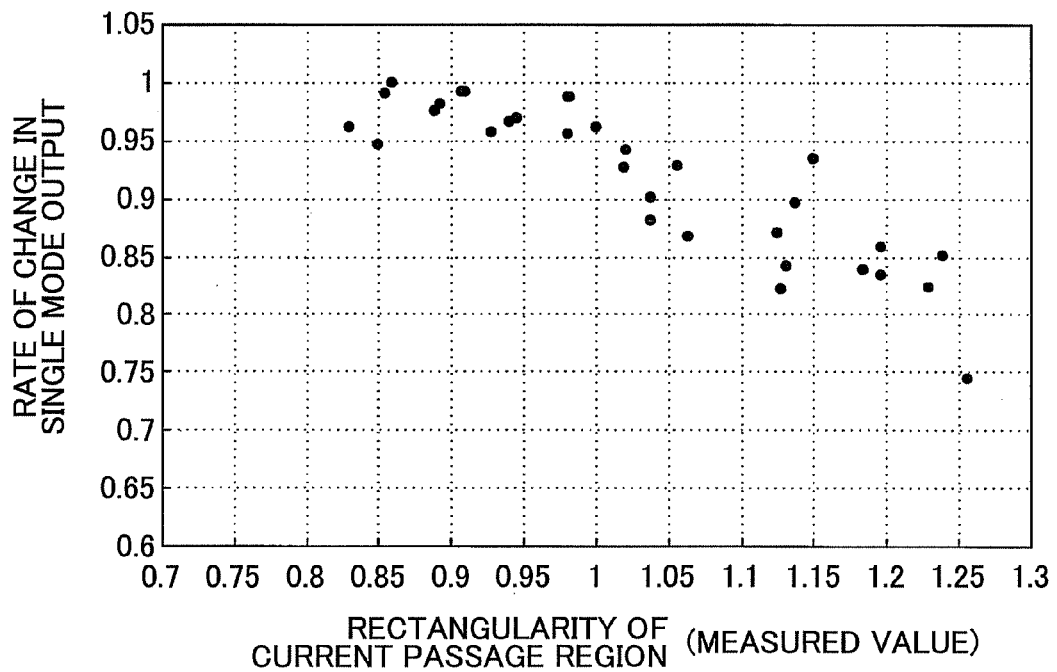
FIG. 22 is a graph illustrating a relationship between a change ratio in the single mode output and the rectangularity of the current passage region after the acceleration test.

FIG. 20 is a graph illustrating a relationship between the single mode output and the rectangularity (measured value) of the current passage region before the acceleration test. FIG. 21 is a graph illustrating a relationship between the single mode output and the rectangularity (measured value) of the current passage region after the acceleration test. FIG. 22 is a graph illustrating a relationship between the single mode output and the rectangularity (measured value) of the current passage region before and after the acceleration test.

Referring back to FIG. 20, there is little obvious correlation between the single mode output and the rectangularity of the current passage region before the acceleration test. However, as illustrated in FIG. 22, the change ratio in the single mode output is in a rage of 0.95 to 1.00 when the rectangularity of the current passage region is less than 1 whereas the change ratio in the single mode output is lower than 0.95 when the rectangularity of the current passage region is greater than 1. That is, optical change with time may occur in the single mode output when the rectangularity of the current passage region is greater than 1.

The reason the change ratio in the single mode output differs based on the rectangularity of the current passage region is examined below.

The emission region in the active layer of the surface-emitting laser element having an oxide confined structure may be regulated by the current passage region. Thus, even if the spatial gain distribution may spread with time, the distribution range may be limited to within the current passage region.

Consequently, the gain distribution of the active layer may not easily spread in a direction where portions of the low reflectance region are missing (Y-axis direction in this case) when the rectangularity of the current passage region is less than 1.

In contrast, the gain distribution of the active layer may easily spread in a region where the reflectance is relatively high and portions of the low reflectance region are missing when the rectangularity of the current passage region is greater than 1. Accordingly, the reflectance of the high-order transverse mode of a laser beam is relatively increased while the single mode output is lowered.

In the surface-emitting laser elements 100 fabricated as above, Lx=4.4 μm and Ly=4.0 μm; that is, the rectangularity is 0.91 and the change ratio in the single mode output is 0.95. Note that in a comparative example having the same area size of the current passage region but having an opposite relationship between Lx and Ly of the surface-emitting laser elements 100 (i.e., Lx=4.0 μm and Ly=4.4 μm), the rectangularity of the current passage region is 1.1 and change ratio in the single mode output is 0.85. As a result, temporal change in the suppression effect of the high-order transverse mode of a laser beam is small in the surface-emitting laser elements 100.

Figure 23:
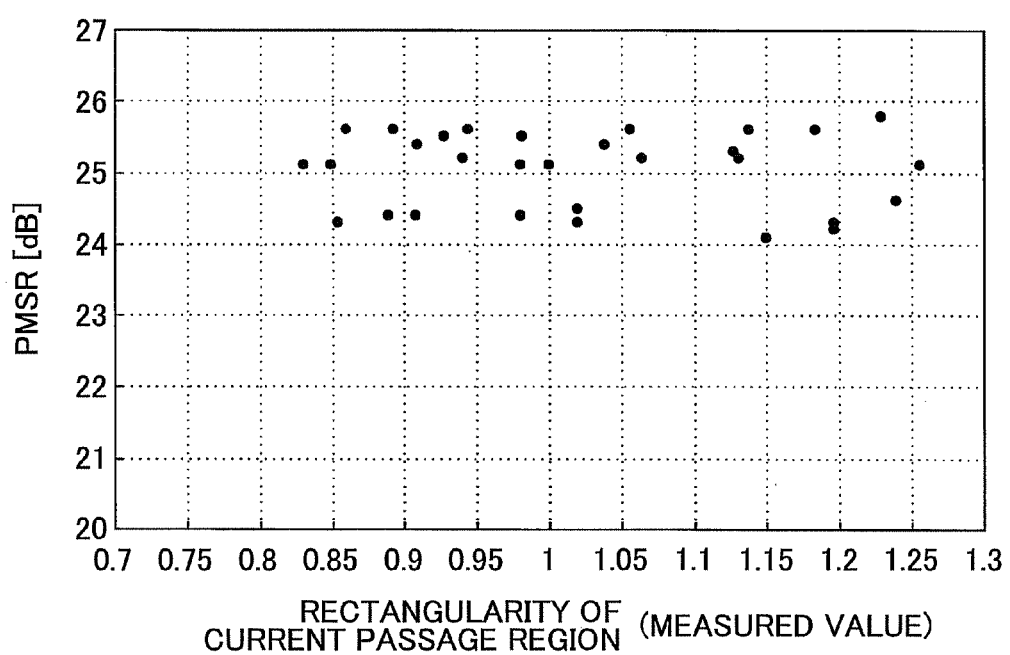
FIG. 23 is a graph illustrating a relationship between a polarization mode suppression ratio (PMSR) and the rectangularity of the current passage region.

Further, in the surface-emitting laser elements 100 used in the above accelerated test, a relationship between an intensity ratio PMSR (Polarization Mode Suppression Ratio) of orthogonal polarization components and the rectangularity of the current passage region was obtained. The result is shown in FIG. 23. As illustrated in FIG. 23, there is a low correlation between the rectangularity of the current passage region and PMSR, indicating that the stability of the polarization is not lowered even when the rectangularity of the passage region is less than 1.

As described above, the surface-emitting laser element 100 according to the embodiment includes the substrate 101, the buffer layer 102 on the substrate 101, a resonator structure having the lower semiconductor DBR 103 and the active layer 105 stacked on the lower semiconductor DBR, the upper semiconductor DBR 107 stacked on the resonator structure and the contact layer 109 stacked on the upper semiconductor DBR 107. In the surface-emitting laser element 100 according to the embodiment, the p-side electrode 113 is provided around the emission region of the emission surface from which a laser beam is emitted. Further, the mode filters 115A and 115B having the optical thickness of λ/4 and formed of the dielectric films are provided in the two sub-regions (first and second sub-regions) located within the emission region and located outside the central portion of the emission region such that the reflectance in the two sub-regions within the emission region is lower than the reflectance in the central portion of the emission region.

Further, the mode filters 115A and 115B are arranged such that the mode filters 115A and 115B have the reflectance of the high-order transverse mode of a laser beam relatively higher in the Y-axis direction compared to the reflectance of the high-order transverse mode in the X-axis direction, and the width in the X-axis direction of the current passage region is larger than that in the Y-axis direction.

In this case, the temporal change in the suppression effect of the high-order transverse mode of a laser beam may be reduced by causing the polarization direction to match the X-axis direction. That is, the polarization direction may be stabilized and the suppression effect of the high-order transverse mode of a laser beam may be stably maintained.

Further, the two sub-regions of the emission region face and sandwich the central portion of the emission region in a direction parallel to the desired polarization direction P. In this case, the dielectric films may be easily and accurately arranged in the two sub-regions.

Moreover, the substrate 101 is a slanted substrate, and the directions in which the first and second sub-regions mutually face are parallel to a direction of the axis of tilt (i.e., X-axis direction) in a main surface of the substrate 101. In this case, use of the slanted substrate may provide the polarization control effect and also improve the stability of the polarization direction.

Further, the resist pattern is formed such that the mesa structure includes the mesa width in the X-axis direction longer than the mesa width in the Y-axis direction. In this case, the rectangularity of the current passage region less than 1 may be easily obtained.

The optical scanner device 1010 according to the embodiment includes the light source 14 having the surface-emitting laser elements 100. Accordingly, microscopic round laser spots may be easily and stably formed on the surface of the photoreceptor drum 1030. Thus, the optical scanning may be carried out with high accuracy.

The laser printer 1000 according to the embodiment includes the optical scanner device 1010. Accordingly, images with high quality may be formed.

Further, the laser printer 1000 according to the embodiment includes the protection layer 111 made of SiN. However, the protection layer 111 may not be limited to SiN. The protection layer 111 may be made of any one of SiNx, SiOx, TiOx, and SiON. Thus, the effect similar to that of the material SiN may be obtained by designing the film thickness based on the corresponding refractive index of the selected material.

Further, in the above embodiment, the first and second sub-regions are arranged such that they face each other based on the axis passing through the center of the emission region and in parallel with the Y-axis. However, the arrangements of the first and second sub-regions may not be limited to such arrangements. The first sub-region may be arranged on one side of the axis passing through the center of the emission region and in parallel with the Y-axis and the second sub-region maybe arranged on the other side of the axis passing through the center of the emission region and in parallel with the Y-axis.

In addition, in the above embodiment, the mode filters 115A and 115B are made of the material the same as the protection layer 111; however, the material of the mode filters 115A and 115B may not be limited to being made of the same material as the protection layer 111.

Figure 24:
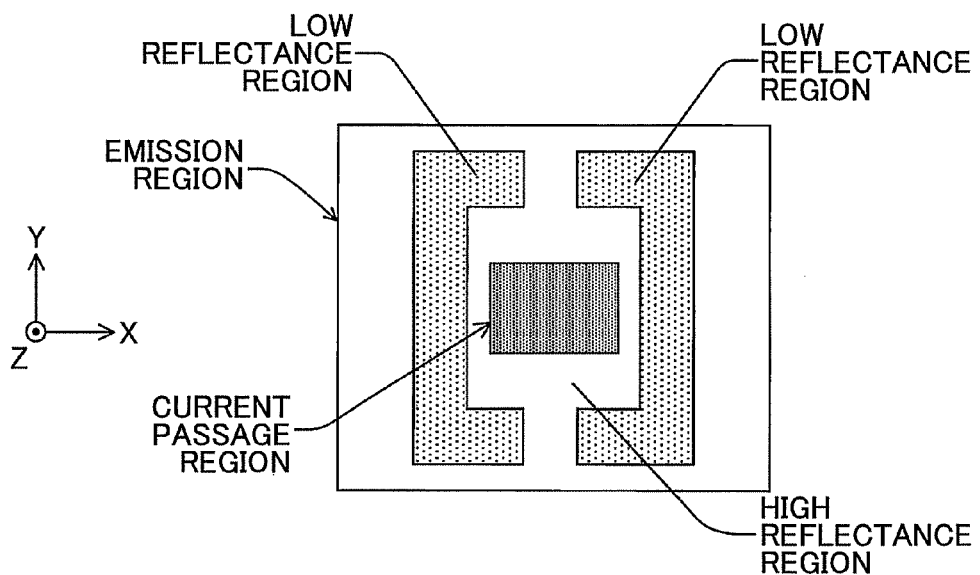
FIG. 24 is a diagram illustrating a first modification of the low reflectance region.
Figure 25:
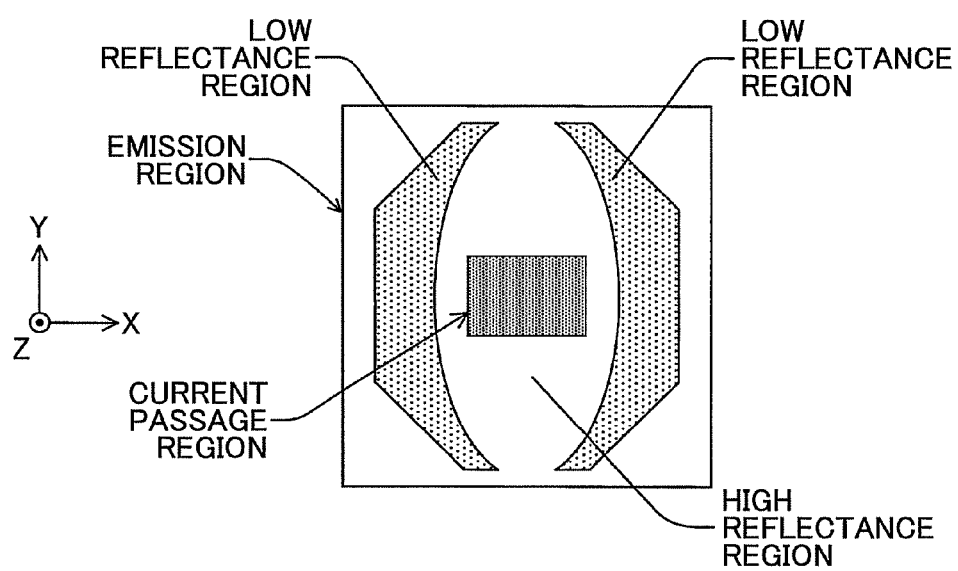
FIG. 25 is a diagram illustrating a second modification of the low reflectance region.

Further, in the above embodiment, the shapes of the two sub-regions are semi circular; however, the shapes of the two sub-regions may not be limited to such shapes, and the two sub-regions may be example shapes illustrated in FIGS. 24 and 25.

Figure 26:
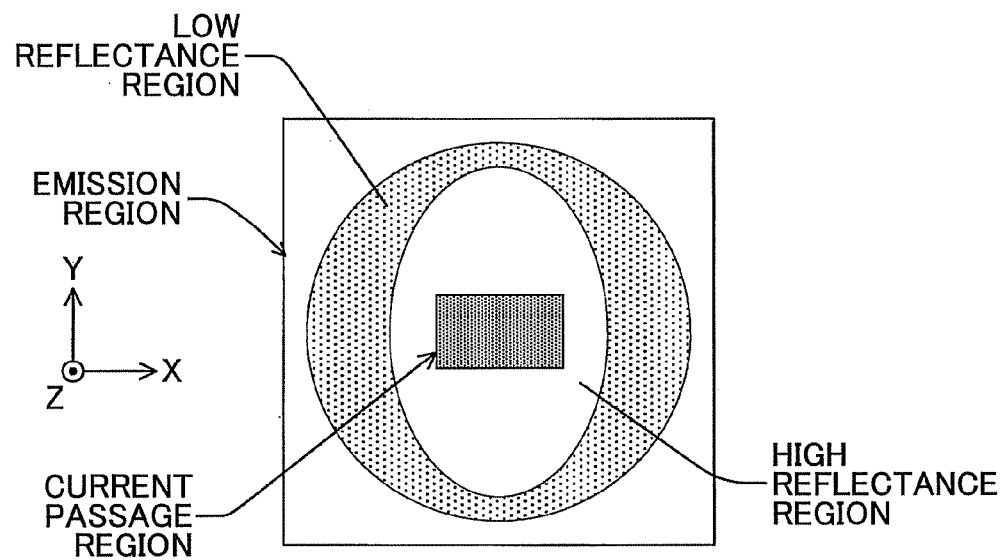
FIG. 26 is a diagram illustrating a third modification of the low reflectance region when the rectangularity of a current passage region is less than 1.
Figure 27:
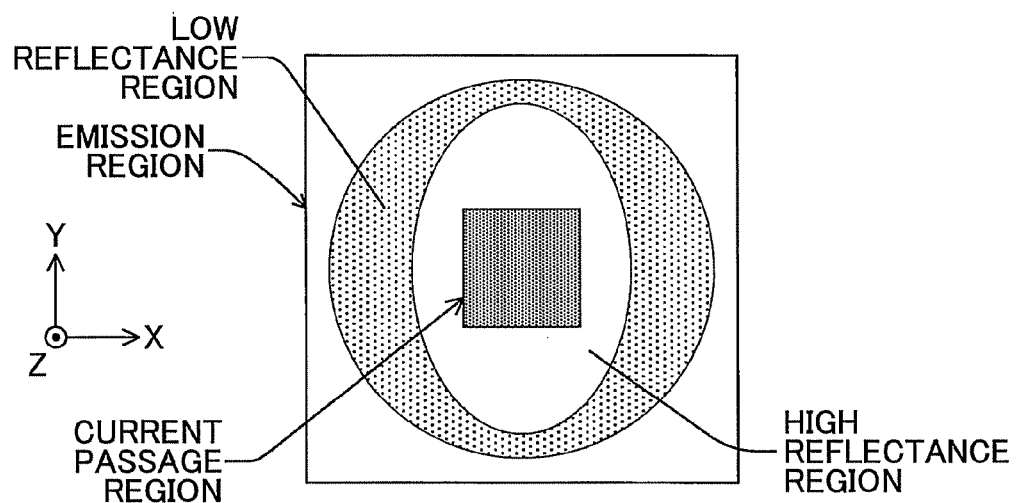
FIG. 27 is a diagram illustrating the third modification of the low reflectance region when the rectangularity of a current passage region equals 1.
Figure 28:
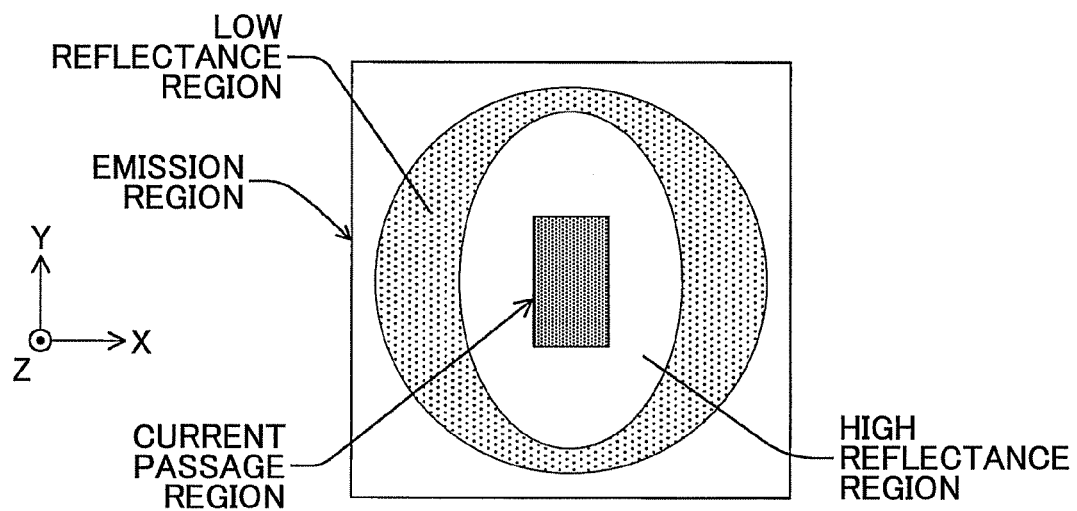
FIG. 28 is a diagram illustrating the third modification of the low reflectance region when the rectangularity of a current passage region is greater than 1.

Further, there may still be a relationship similar to the relationship described above between the rectangularity of the current passage region and change ratio in the single mode output when the sub-region has a shape where the low reflectance region encircles the center of the emission region as illustrated in FIGS. 26 to 28 but the shape of the sub-region has anisotropy. As illustrated in FIGS. 26 to 28, the reflectance with the high-order transverse mode of a laser beam is relatively high in a longer distance direction (Y-axis direction in this case) between the center of the emission region and the low reflectance region, which corresponds to the direction where portions of the low reflectance region are missing (i.e., Y-axis direction) of the above embodiment. Accordingly, when the relationship between the rectangularity of the current passage region and the low reflectance region is similar to that illustrated in FIG. 26, the temporal change in the suppression effect of the high-order transverse mode of a laser beam is reduced in the same manner as the above embodiment.

Figure 29:
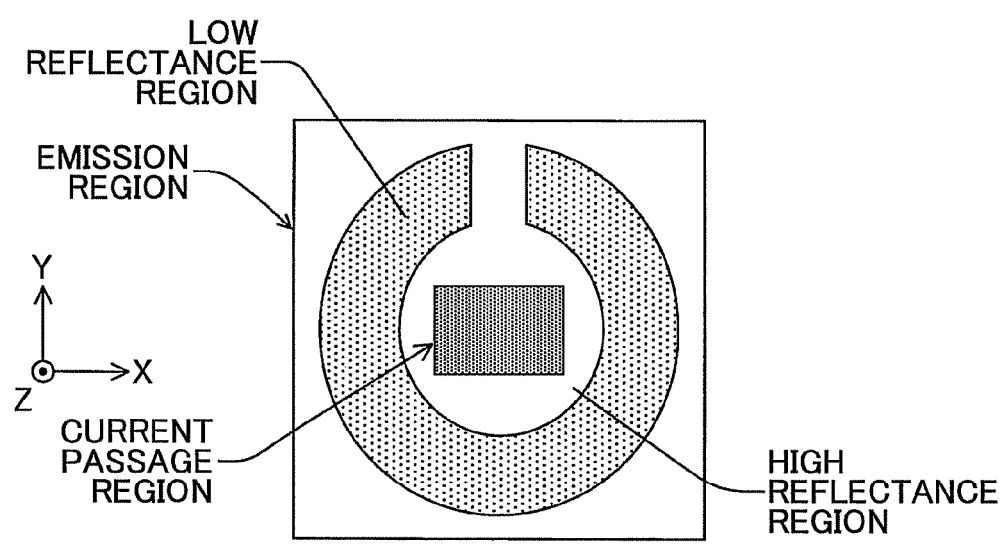
FIG. 29 is a diagram illustrating a fourth modification of the low reflectance region.

Further, as illustrated in FIG. 29, the mode filter may include a first end and a second end such that the mode filter partially encircles the center of the emission region.

Figure 30:
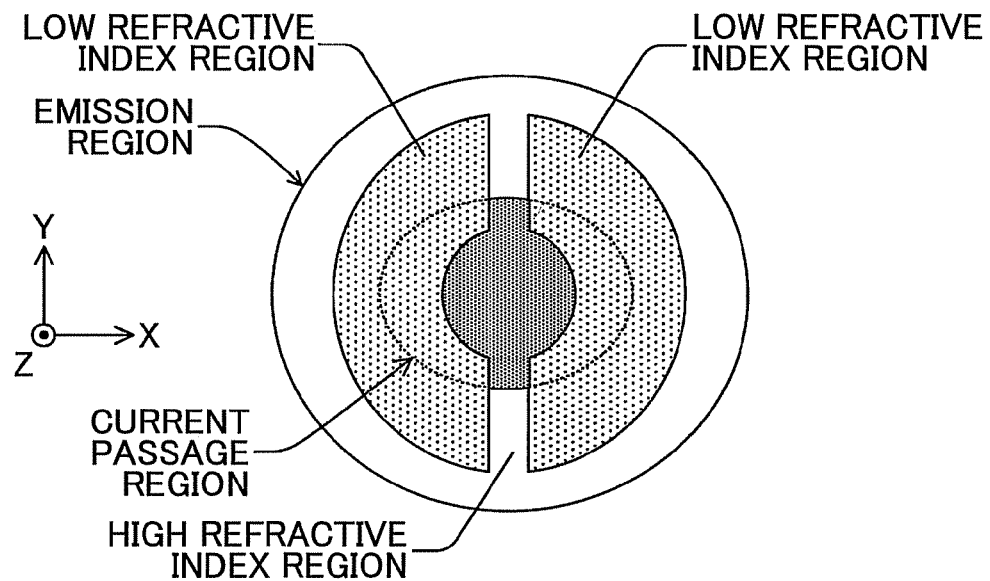
FIG. 30 is a diagram illustrating an example 1 of the current passage region having an oval shape.
Figure 31:
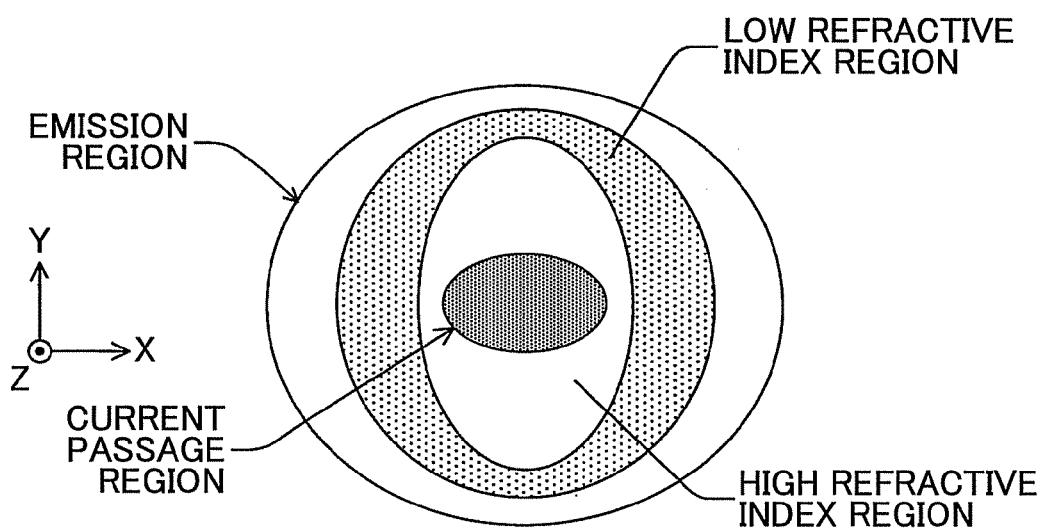
FIG. 31 is a diagram illustrating an example 2 of the current passage region having an oval shape.

Further, in the above embodiment, the current passage region has a rectangular shape; however, the shape of the current passage region is not limited to the rectangular shape, but may be any shape other than the rectangular shape such as a round shape (see FIGS. 30 and 31) or a polygonal shape.

Figure 32:
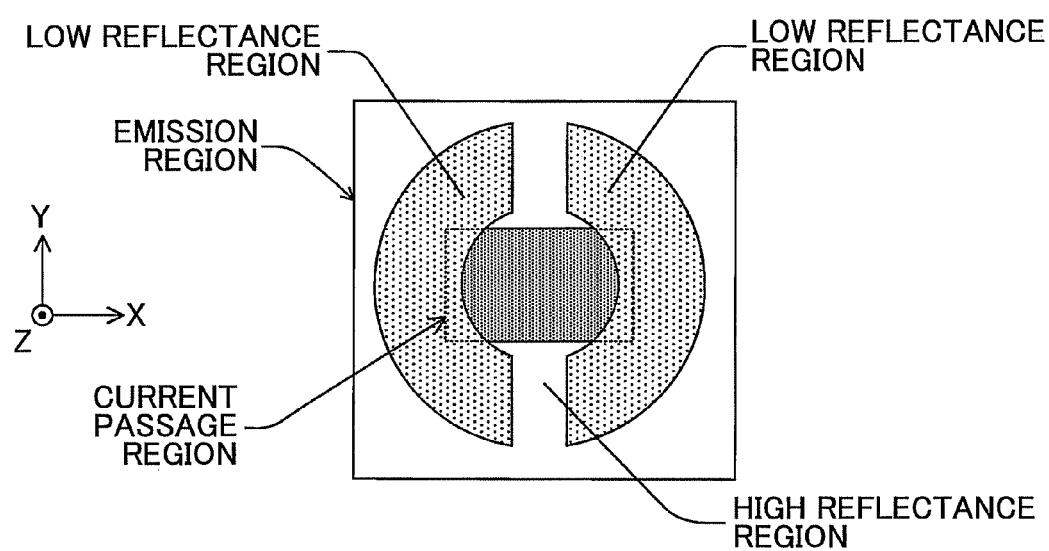
FIG. 32 is a diagram illustrating an example of the current passage region having a partial overlap with the low reflectance region.

Further, in the above embodiment, as illustrated in FIG. 32, part of the current passage region and part of the low reflectance region may be overlapped as viewed in the Z-axis direction.

Further, in the above embodiment, the rectangularity of the current passage region is changed; however, the rectangularity of the current passage region may not be changed. Instead, the width of the current passage region in a direction where portions of the low reflectance regions are missing (i.e., Y-axis direction) may be reduced.

Figure 33A:
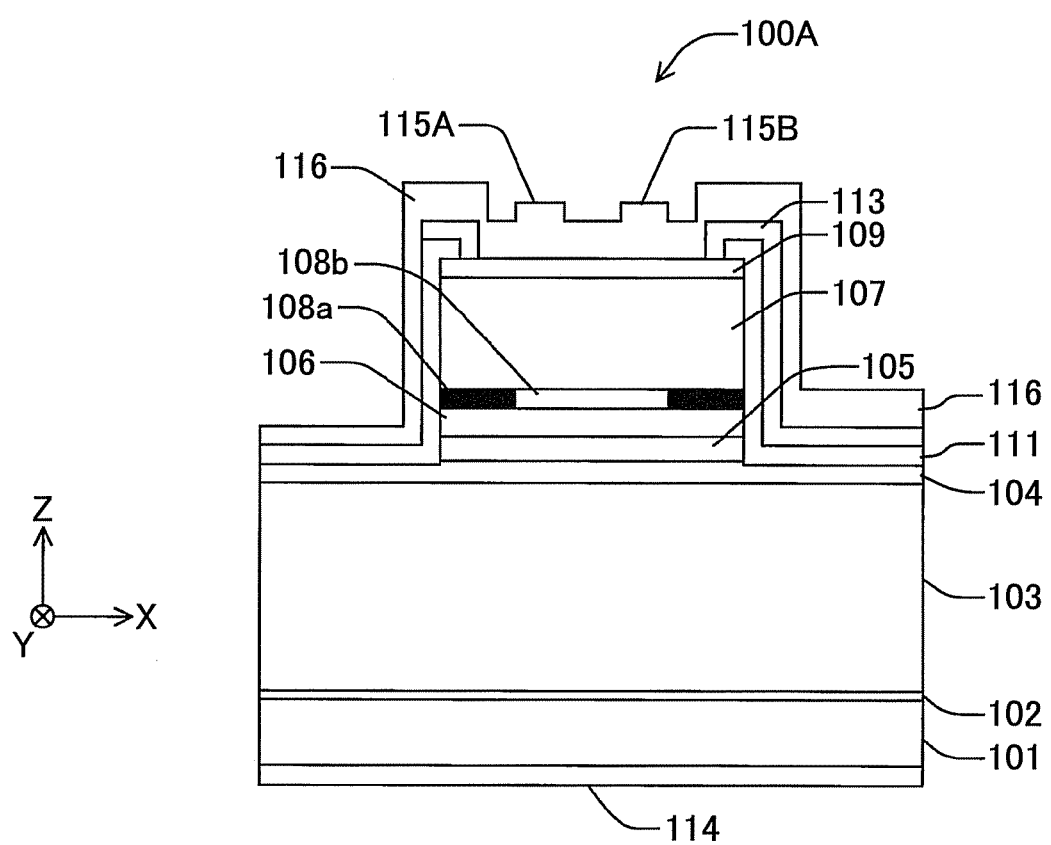
FIGS. 33A and 33B are diagrams illustrating a first modification of the surface-emitting laser element (i.e., a surface-emitting laser element 100A)
Figure 33B:
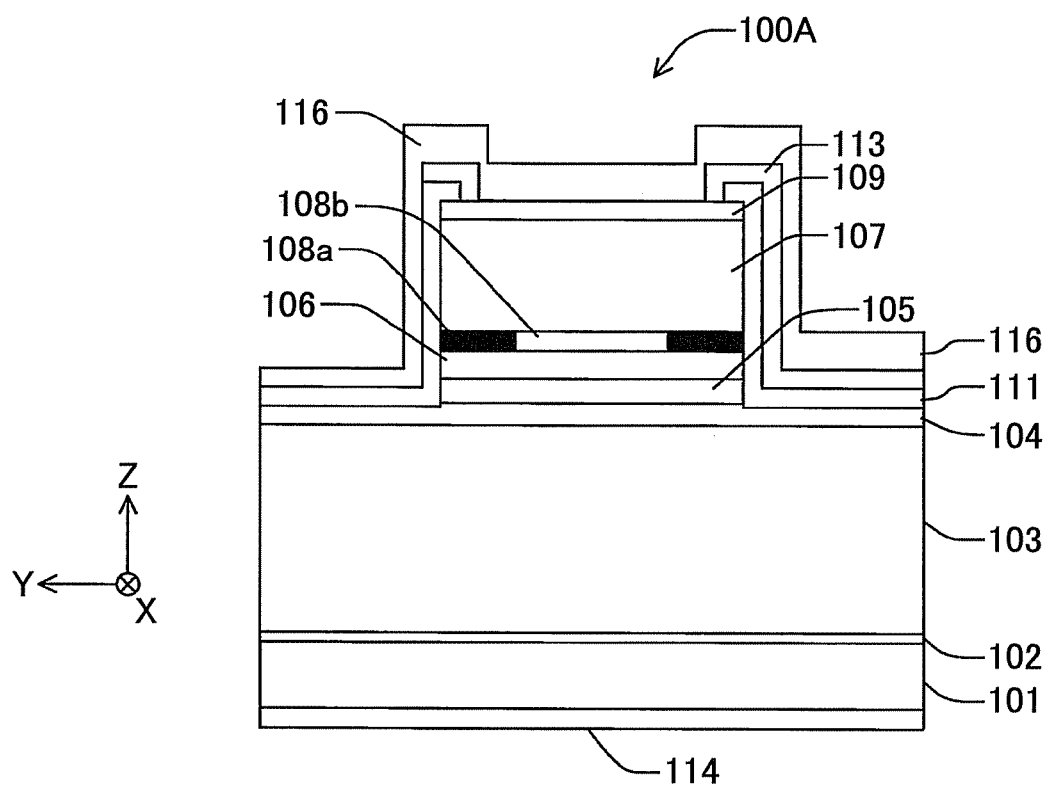

Further, in the above embodiment, the optical thickness of each mode filter is $\lambda/4$; however the optical thickness of each mode filter is not limited to $\lambda/4$. For example, as illustrated in FIGS. 33A and 33B, a surface-emitting laser element 100A may include mode filters 115A and 115B where each has an optical thickness of $3\lambda/4$. That is, the optical thickness of each mode filter may be an odd multiple of $\lambda/4$ to obtain the suppression effect of the high-order transverse mode of a laser beam similar to that obtained in the surface-emitting laser element 100 in the above embodiment. Note that FIG. 33A is a cross-sectional diagram illustrating the surface-emitting laser element 100A in the X-Z plane, and FIG. 33B is a cross-sectional diagram illustrating the surface-emitting laser element 100A in the Y-Z plane.

In this case, a p-side electrode 113 is formed, and a protection layer 116 made of SiN is subsequently formed by chemical vapor deposition (CVD) such that the optical thickness of the protection layer 116 is $2\lambda/4$ in a manner similar to the above embodiment. Specifically, since a refractive index n of SiN is 1.86 and an oscillation wavelength $\lambda$ of SiN is 780 nm, the actual film thickness ($=2\lambda/4$ n) of the protection layer is determined as approximately 210 nm.

In this process, the central portion of the emission region is coated with the protection layer (dielectric film) 116 having the optical thickness of $2\lambda/4$. Further, the peripheral portions of the emission region excluding the two sub-regions (first and second sub-regions) are coated with the protection layer (dielectric film) 116 having the optical thickness of $2\lambda/4$.

Further, in the surface-emitting element 100A, since the entire emission surface is coated with the protection layer (dielectric film) 116, the emission surface may be protected from oxidation and contamination. Note that the central portion of the emission region is coated with the protection layer (dielectric film) 116. However, since the optical thickness is an even multiple of the $\lambda/2$, the reflectance may not be lowered. Thus, optical properties similar to those without the protection layer (dielectric film) 116 may be obtained.

That is, if the optical thickness of the portion preferably having a low reflectance is an odd multiple of $\lambda/4$ and the optical thickness of the portion other than that having the low reflectance is an even multiple of $\lambda/4$, the suppression effect of the high-order transverse mode of a laser beam similar to that obtained in the surface-emitting laser element 100 in the above embodiment may be obtained.

Figure 34A:
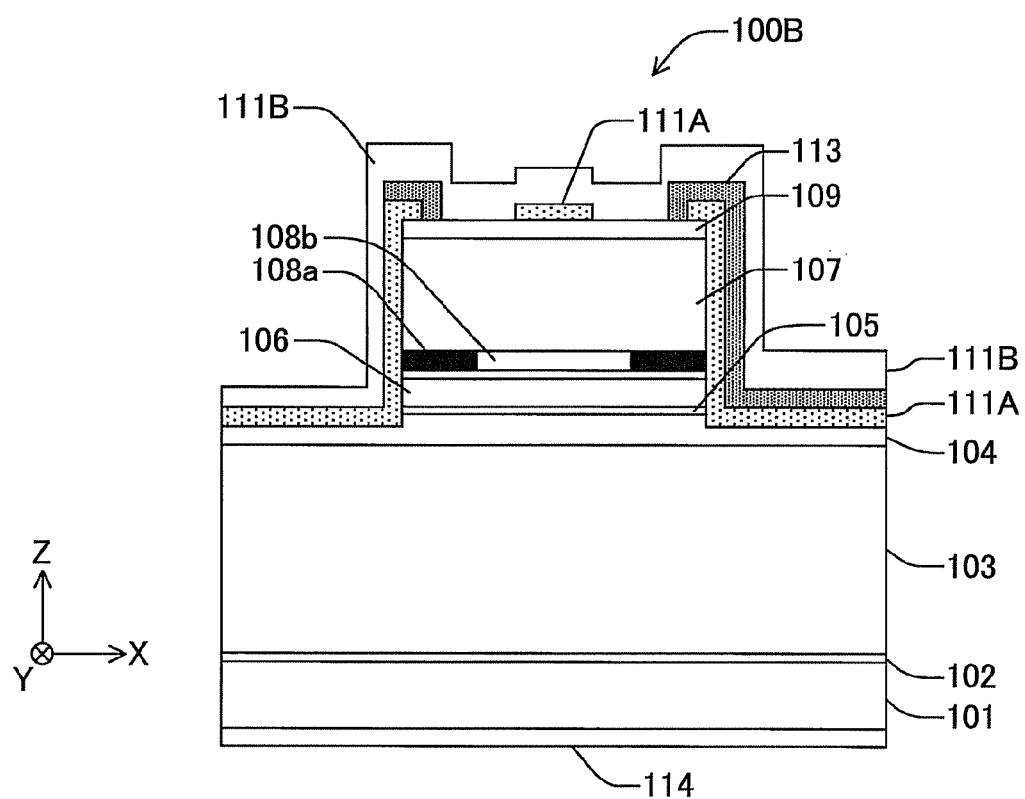
FIGS. 34A and 34B are diagrams illustrating a second modification of the surface-emitting laser element (i.e., a surface-emitting laser element 100B)
Figure 34B:
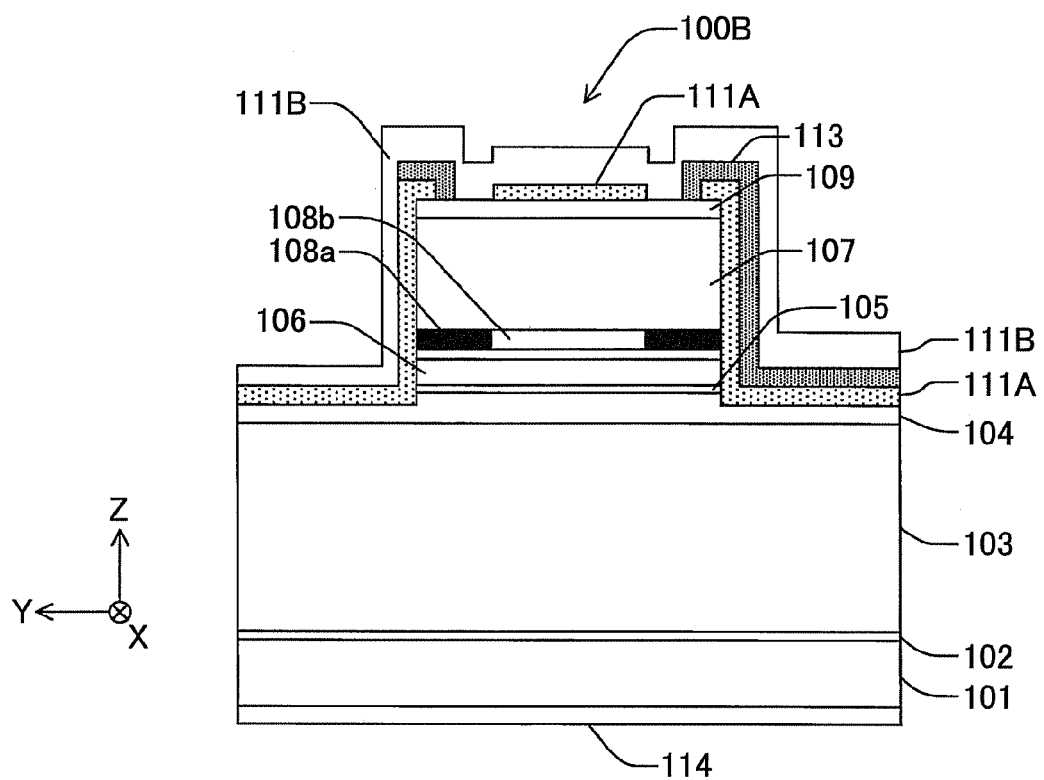

Further, a surface-emitting laser element 100B illustrated in FIGS. 34A and 34B may be employed in place of the surface-emitting laser element 100 according to the above embodiment. In the surface-emitting laser element 100B, two dielectric films each having a different refractive index is provided in the central portion of the emission region. In this case, a multilayer mirror having a pair of the two dielectric films mutually having different refractive indexes is formed in the central portion of the emission region. Accordingly, the reflectance of the central portion of the emission region is higher than the peripheral portion of the emission region in the surface-emitting laser element 100B. As a result, the surface-emitting laser element 100B has a higher reflectance difference between the high reflectance region and the low reflectance region than that of the surface-emitting laser element 100. Thus, the oscillation of the high-order transverse mode of a laser beam in the surface-emitting laser element 100B is further suppressed compared to the suppression of the oscillation of the high-order transverse mode of a laser beam in the surface-emitting laser element 100. Note that the multilayer mirror in the surface-emitting laser element 100B may include at least one pair of the two dielectric films mutually having different refractive indexes.

Next, a method of fabricating the surface-emitting laser element 100B is briefly described.

In this method, (Step S1B) through (Step S5B) are similar steps as (Step 1) through (Step 5) in the above embodiment.

(Step S6B) A protection layer 111A made of SiO$_2$ is formed over the entire surface of the stacked product by chemical vapor deposition (CVD). In this example, the protection layer 111A has an optical thickness of $\lambda/4$. Specifically, since a refractive index n of SiO$_2$ is 1.45 and an oscillation wavelength $\lambda$ of SiO$_2$ is 780 nm, the actual film thickness ($=\lambda/4$ n) of the protection layer 111A is determined as approximately 134 nm.

Figure 35:
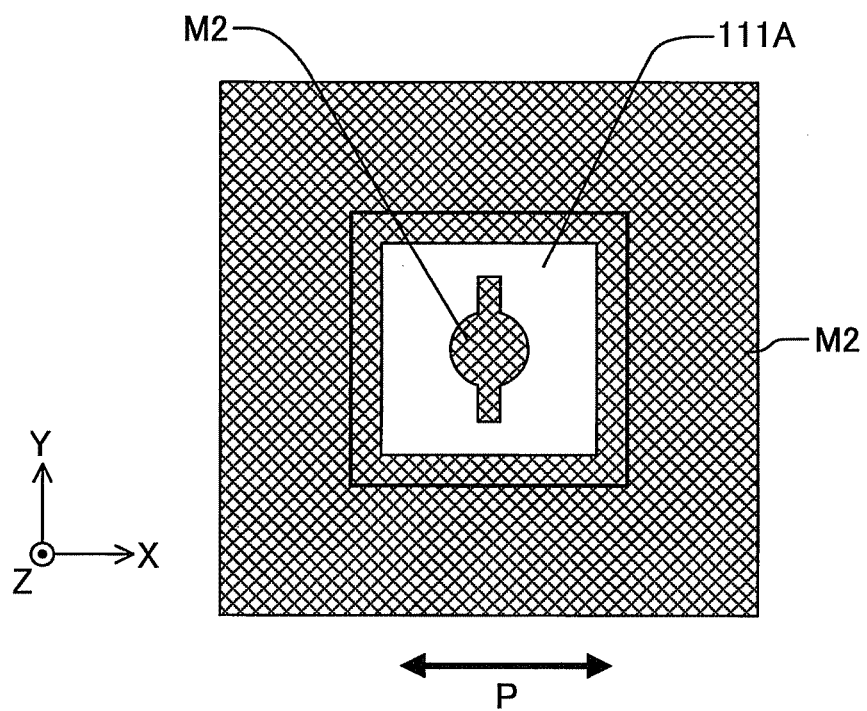
FIG. 35 is a first example diagram illustrating a method for fabricating the surface-emitting laser element 100B.
Figure 36:
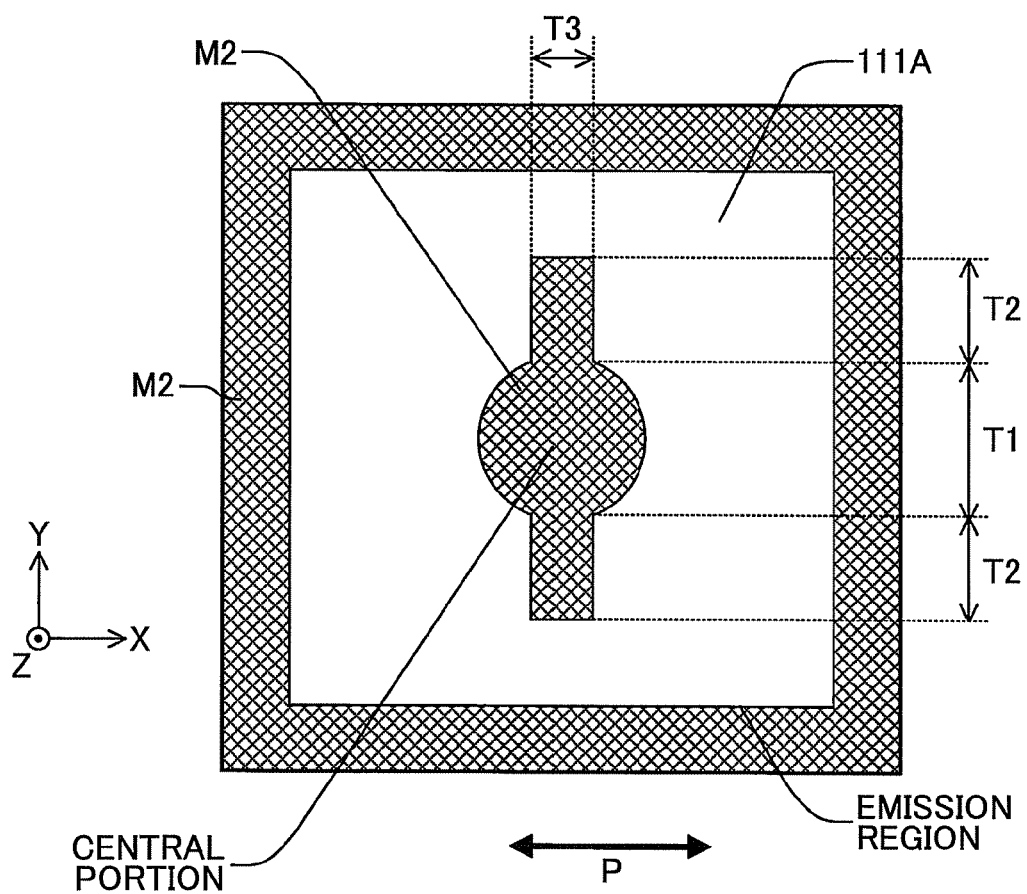
FIG. 36 is an enlarged diagram illustrating an upper surface of a mesa structure cut out of the surface-emitting laser element illustrated in FIG. 35.

(Step S7B) Etching masks (i.e., masks M2) for forming an opening of the p-side electrode contact are formed on an upper side of the mesa that is an emission surface of the laser beam. As illustrated in the mesa portion of FIG. 35 and an enlarged mesa portion in FIG. 36, masks M2 are formed in the peripheral portion of the mesa, the upper surface of the mesa, and regions having different widths in the central portion of the mesa in a desired polarization direction P (i.e., the X-axis direction in this case) and in a direction in perpendicular to the desired polarization direction P such that these regions are not etched. Specifically, reference numerals T1, T2, and T3 in FIG. 36 are 4.5 μm, 4 μm, and 2.1 μm, respectively. The unetched central portion of the mesa includes a combined shape of a round shape having a diameter T1 and two rectangular shapes each having a width T3 in the X-axis direction and a length T2 in the Y-axis direction.

(Step S8B) The protection layer 111A is etched by buffered Hydrofluoric Acid (BHF) such that the protection layer 111A has an opening for the p-side electrode contact.

Figure 37A:
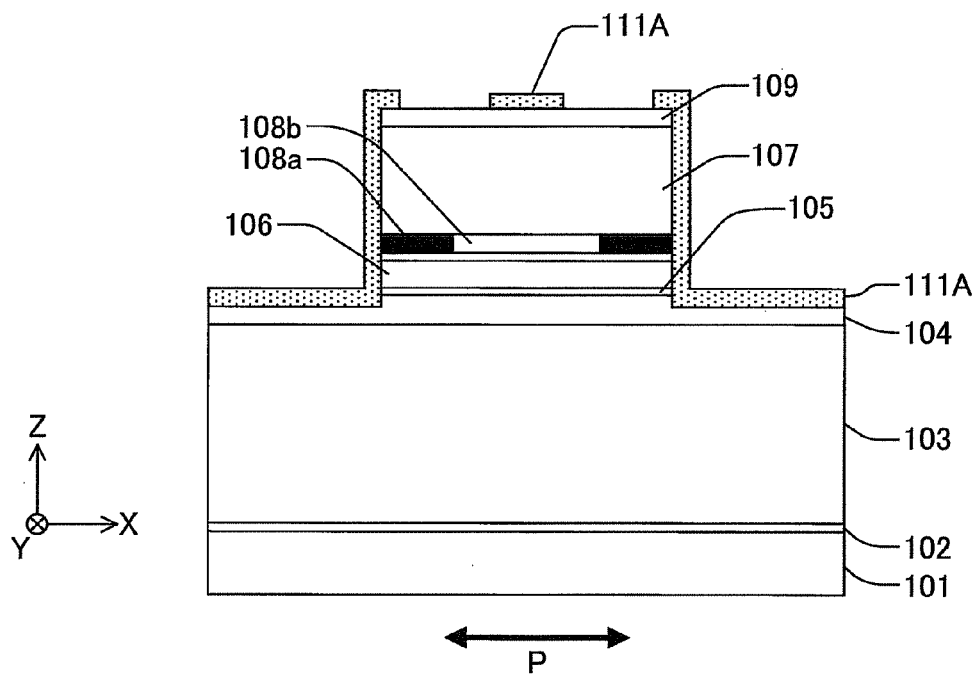
FIGS. 37A and 37B are second example diagrams illustrating a method for fabricating the surface-emitting laser element 100B.
Figure 37B:
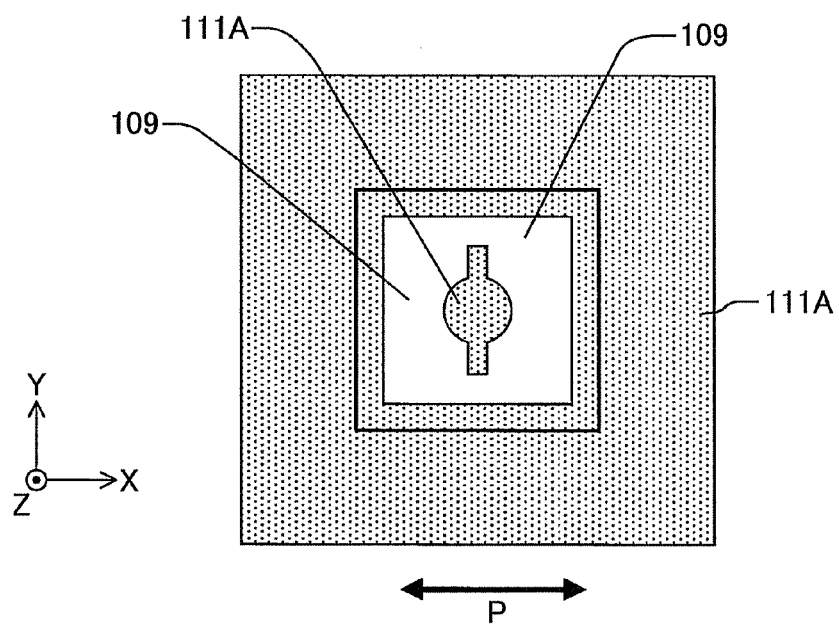

(Step S9B) The masks M2 are then removed as illustrated in FIGS. 37A and 37B.

(Step S10B) A square resist pattern having 14 μm on a side is formed in a region corresponding to the light-emitting portion on the upper side of the mesa to deposit p-side electrode material. The p-side electrode material may become a multilayer film of Cr/AuZn/Au or a multilayer film of Ti/Pt/Au.

Figure 38:
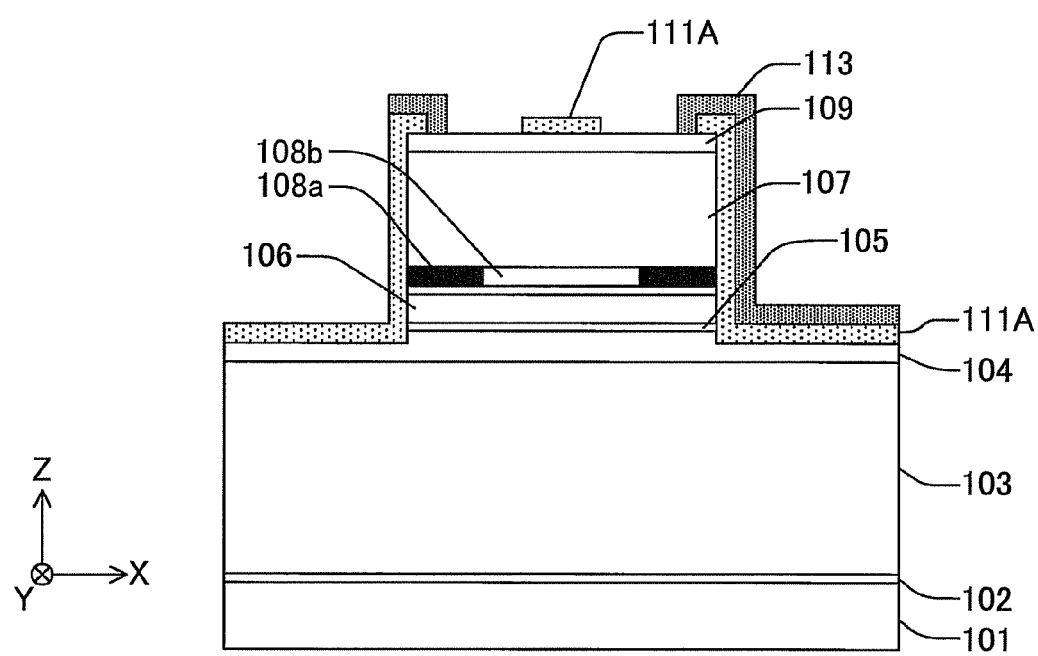
FIG. 38 is a third example diagram illustrating a method for fabricating the surface-emitting laser element 100B.
Figure 39:
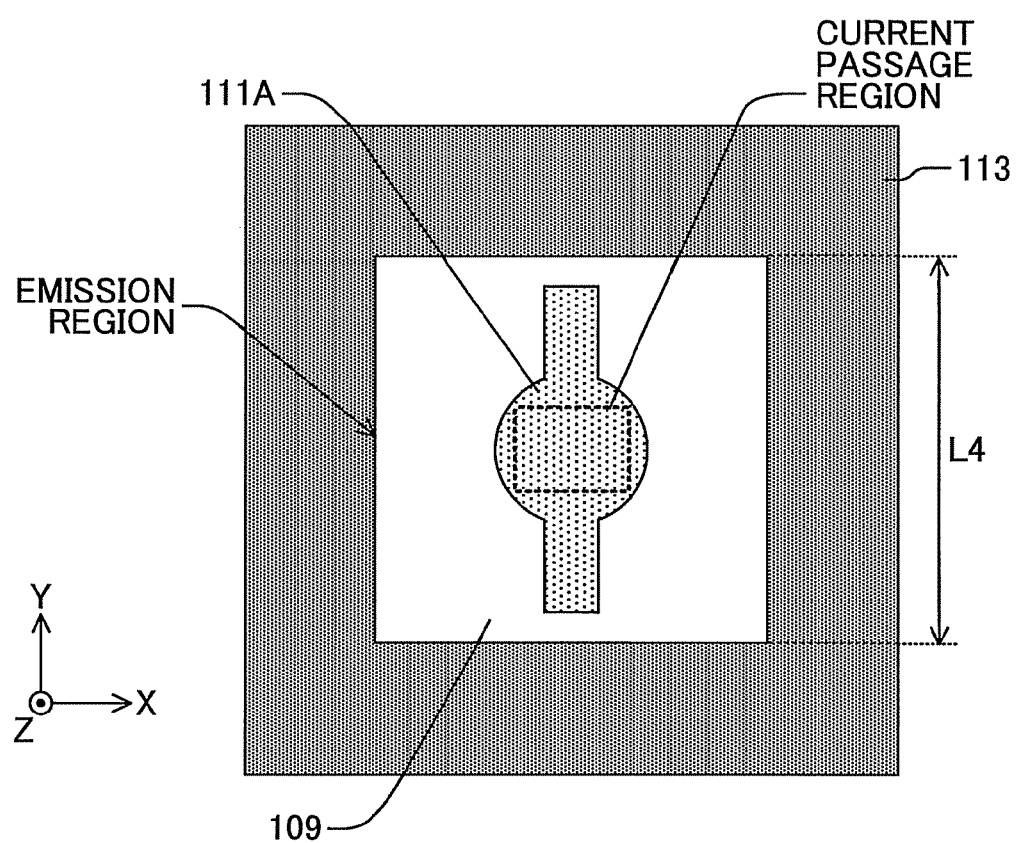
FIG. 39 is an enlarged diagram illustrating an upper surface of a mesa structure cut out of the surface-emitting laser element illustrated in FIG. 38.

(Step S11B) The electrode material deposited in the region (emission region) corresponding to the light-emitting portion is lifted off to form the p-side electrode 113 as illustrated in FIG. 38. The region enclosed by the p-side electrode 113 is the emission region. Note that FIG. 39 illustrate an enlarged diagram illustrating the mesa cut out of the mesa structure illustrated in FIG. 38. The emission region has a square shape having a length L4 (14 μm in this case) on a side.

Figure 40A:
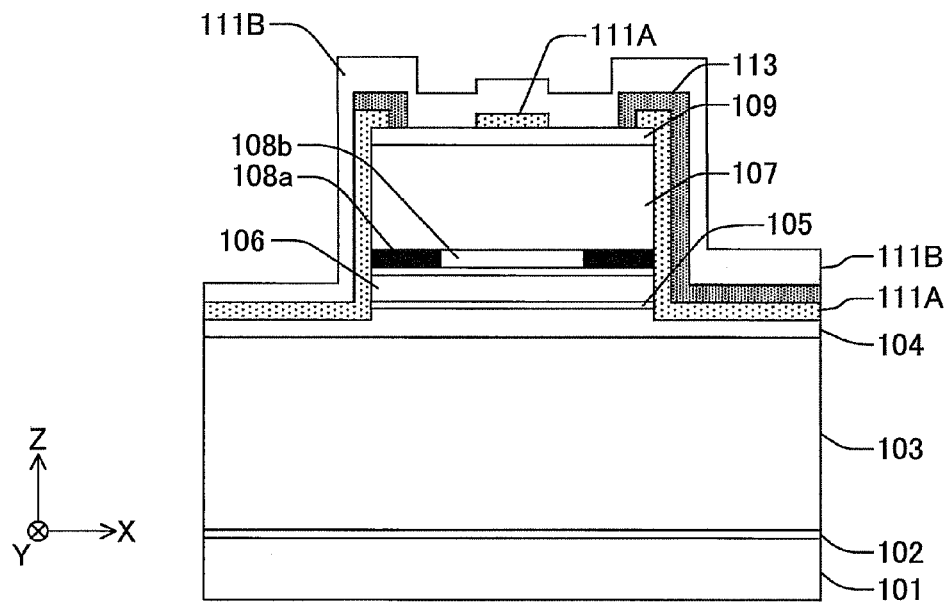
FIGS. 40A and 40B are fourth example diagrams illustrating a method for fabricating the surface-emitting laser element 100B.
Figure 40B:
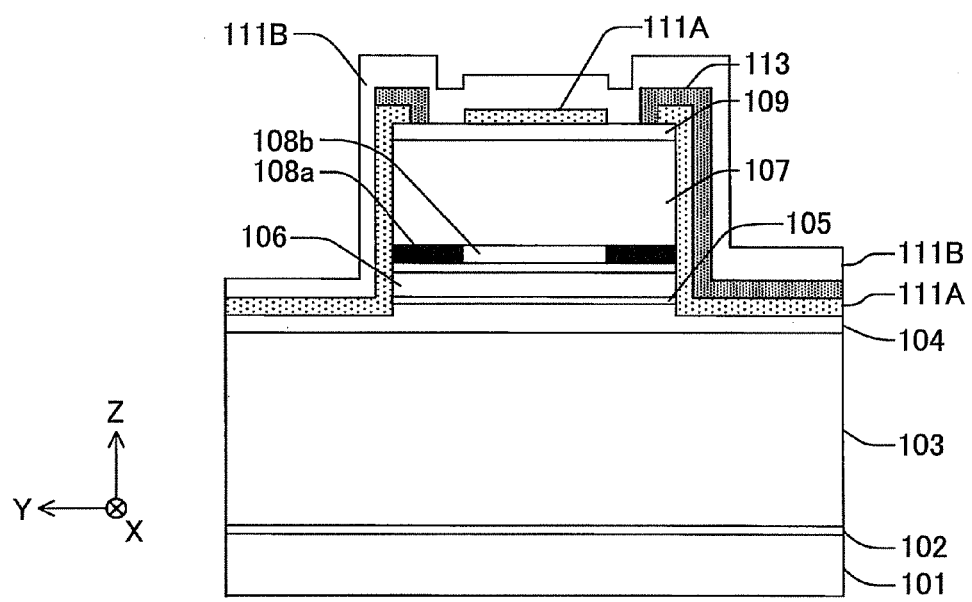

(Step S12B) A protection layer 111B made of SiN is formed over the entire surface of the stacked product by chemical vapor deposition (CVD) as illustrated in FIGS. 40A and 40B. In this example, the protection layer 111B has an optical thickness of $\lambda/4$. Specifically, since a refractive index n of SiN is 1.87 and an oscillation wavelength $\lambda$ of SiN is 780 nm, the actual film thickness $(=\lambda/4\ n)$ of the protection layer is determined as approximately 105 nm. In this process, since a dielectric multilayer mirror having a pair of two different dielectric films (i.e., $SiO_2$ film and SiN film) each having a different refractive index is formed in the central portion of the emission region, the central portion of the emission region has a relatively high reflectance. By contrast, since the dielectric film having the optical thickness of $\lambda/4$ is formed in the peripheral portion of the emission region, the peripheral portion of the emission region has a reflectance lower than that of the central portion of the emission region.

Further, in this method, (Step S13B) through (Step S15B) are similar steps as (Step 12) through (Step 14) in the above embodiment.

Figure 41:
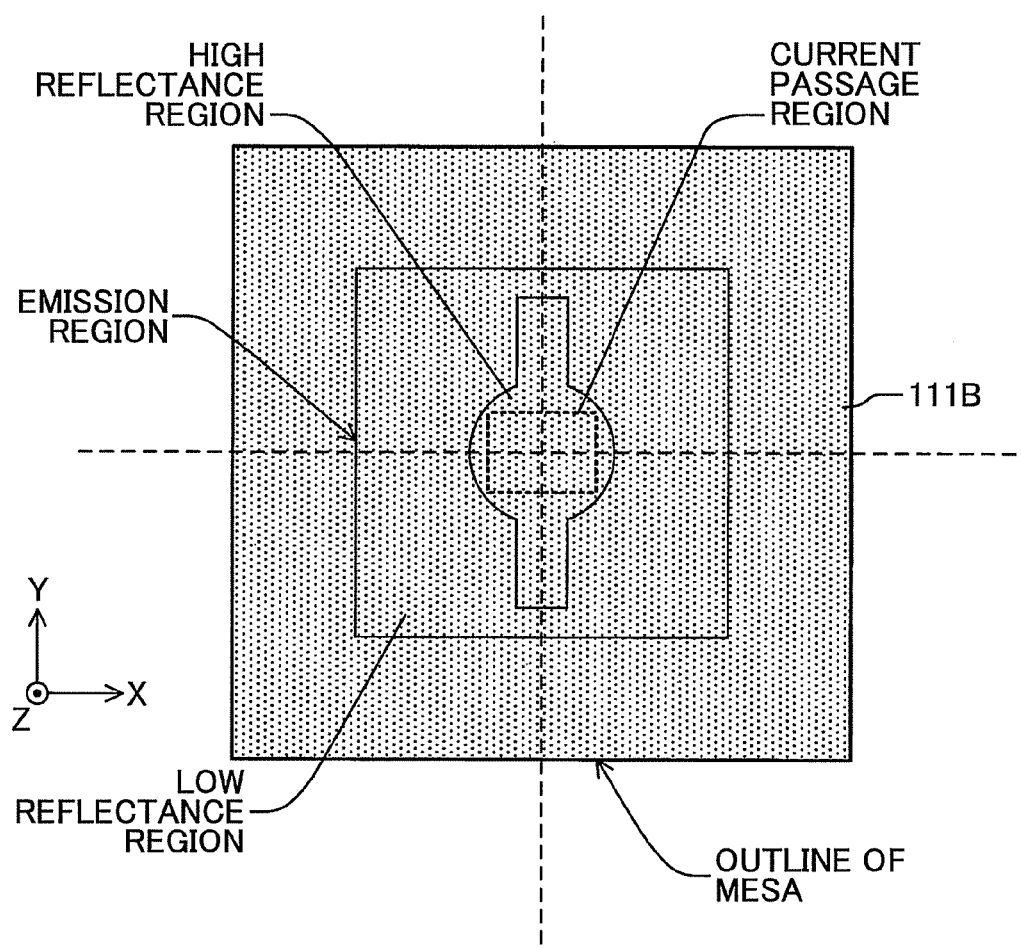
FIG. 41 is an enlarged diagram illustrating an upper surface of a mesa structure cut out of the surface-emitting laser element 100B.

In the surface-emitting laser element 100B fabricated in the steps of the above method, as illustrated in FIG. 41, a length in the X-axis direction of the current passage region is longer than a length in the Y-axis direction of the current passage region, and the reflectance of the higher-order transverse mode of the laser beam is higher in the Y-axis direction than that of the higher-order transverse mode of the laser beam in the X-axis direction, based on two orthogonal linear lines passing through the center of the emission region as illustrated in FIG. 41. Accordingly, gain distribution in the active layer may be difficult to spread in a direction (Y-axis direction in this case) where the reflectance is relatively high, thereby suppressing the reduction in an amount of the single mode output.

Figure 42:
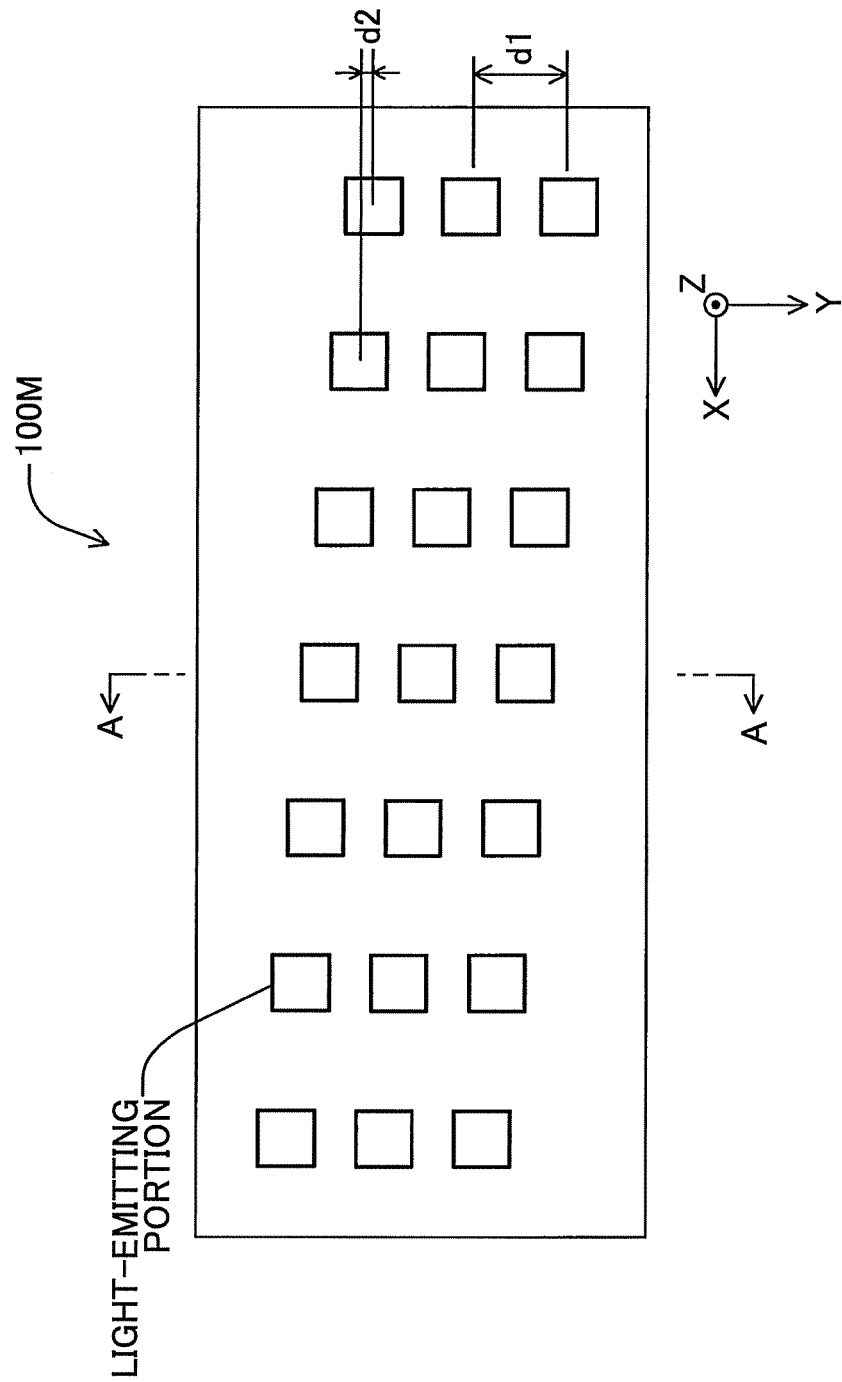
FIG. 42 is a diagram illustrating a surface-emitting laser array.

Further, the light source 14 may include a surface-emitting laser array 100M illustrated in FIG. 42 in place of the surface-emitting laser element 100 according to the above embodiment.

The surface-emitting laser array 100M includes plural (21 in this case) light-emitting portions arranged on the same substrate. In FIG. 42, the X-axis direction is a main-scanning corresponding direction, and the Y-axis direction is a sub-scanning corresponding direction. The light-emitting portions are arranged at equal light-emitting portion intervals d2 when all the light-emitting portions are orthogonally projected in a virtual line extended in the Y-axis direction. That is, 21 light-emitting portions are two dimensionally aligned. In this application, "light-emitting portion interval" is a center-to-center distance between the two light-emitting portions. Note that the number of light-emitting portions is not limited to 21.

Figure 43:
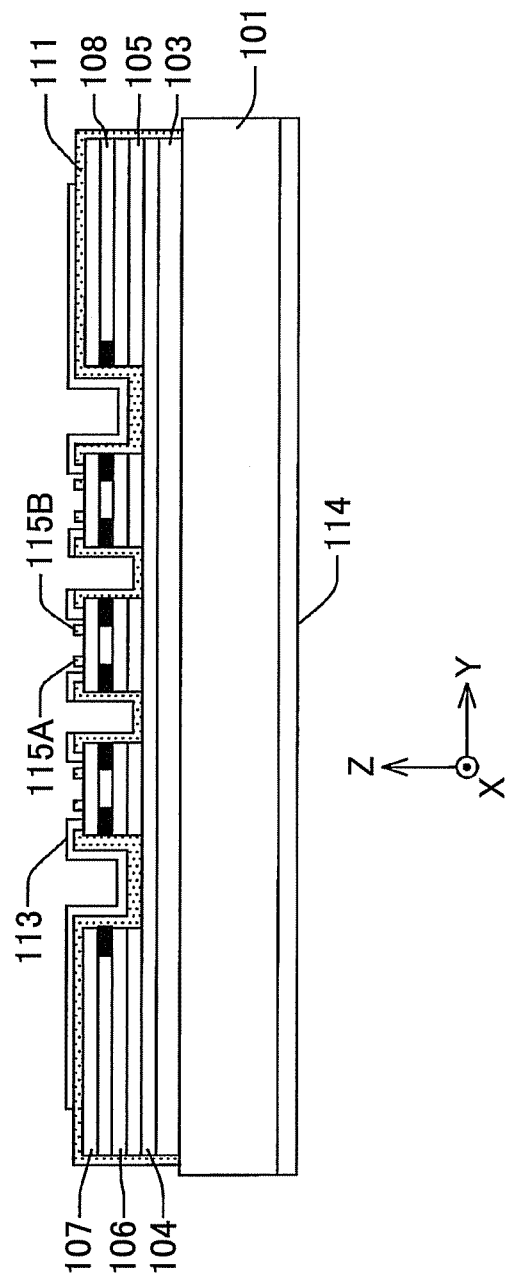
FIG. 43 is a cross-sectional view of the surface-emitting laser array cut along a line A-A of FIG. 42.

As illustrated in FIG. 43 of an A-A sectional diagram of FIG. 42, each light-emitting portion of the surface-emitting laser array 100M has a structure similar to that of the surface-emitting laser element 100. In addition, the surface-emitting laser array 100M may be fabricated in the same manner as the fabrication method of the surface-emitting laser element 100. Thus, single single transverse mode of plural laser beams having uniform polarization directions between the light-emitting portions may be stably obtained. Accordingly, 21 densely arranged round minute optical spots may be simultaneously and stably formed on the photoreceptor drum 1030.

In the surface-emitting laser array 100M, since the light-emitting portions are arranged at equal light-emitting portion intervals d2 when all the light-emitting portions are orthogonally projected in a virtual line extended in the sub-scanning direction, the photoreceptor drum 1030 maybe used as the photoreceptor drum having the light-emitting portions arranged at equal light-emitting portion intervals d2 on its surface in the sub-scanning direction by controlling emitting timing of laser beams.

If the above light-emitting portion interval d2 is 2.65 μm, and the magnification of the optical scanner device 1010 is doubled (2×), the optical scanner device 1010 may scan an image with high-density resolution of 4800 dpi. Further, if the number of the light-emitting portions is increased, the light-emitting portions are arranged in an array configuration where the interval d2 is reduced by narrowing a pitch d1 in the sub-scanning direction, and the magnification of the optical system is reduced, the optical scanner device 1010 may scan an image with even higher-density resolution, thereby printing the image with high quality. Note that the writing intervals in the main-scanning direction may be easily controlled by adjusting timing of the light-emitting portions.

In this case, the laser printer 1000 may print the image without lowering printing speeds despite the fact that writing dot density is increased. Further, the laser printer 1000 may print the image with higher printing speeds when the writing dot density is constant.

In this case, since the polarization directions of the flux emitted from the light-emitting portions are stably aligned, the laser printer 1000 may stably form the image with high quality.

Further, the light source 14 may include a surface-emitting laser array having the one-dimensionally arranged light-emitting portions similar to the surface-emitting laser elements 100 in place of the surface-emitting laser elements 100 according to the above embodiment.

In the above embodiment, the normal direction of the main surface of the substrate 101 is slanted at 15 degrees toward the crystal orientation [1 1 1]A direction from the crystal orientation [1 0 0] direction; however, the slant of the normal direction of the main surface of the substrate 101 is not limited to the above described slant. The normal direction of the main surface of the substrate 100 maybe slanted toward one direction of the crystal orientation [1 1 1]A from one direction of the crystal orientation [1 0 0].

Further, in the above embodiment, the oscillation wavelength of each light-emitting portion is 780 nm; however, the oscillation wavelength of the light-emitting portion is not limited to 780 nm. The oscillation wavelength of the light-emitting portion may be changed based on characteristics of the photoreceptor drum.

Further, each surface-emitting laser element may be used for other apparatuses or devices other than the image forming apparatus. In such cases, the oscillation wavelength may be 650 nm, 850 nm, 980 nm, 1.3 µm, or 1.5 µm based on application purposes. In this case, a mixed crystal semiconductor material is used for the active layer formed of the semiconductor material. For example, if the oscillation wavelength is 650 nm, AlGaInP series mixed crystal semiconductor material is used. If the oscillation wavelength is 980 nm, InGaAs series mixed crystal semiconductor material is used. If the oscillation wavelength is 1.3 µm or 1.5 µm, InNAs(Sb) series mixed crystal semiconductor material is used.

Further, the oscillation wavelength is selected based on a material of each reflecting mirror and a configuration of the reflecting mirror. Accordingly, an emission portion having a desired oscillation wavelength may be formed. For example, the emission portion may be formed of a mixed crystal semiconductor material, such as AlGaInP mixed crystal semiconductor material, other than AlGaAs mixed crystal semiconductor material. Note that a preferable combination of the low refractive index layer and the high refractive index layer may be those transparent for the oscillation wavelength and that have the greatest difference in the refractive index between the low refractive index layer and the high refractive index layer.

Further, in the above embodiment, the laser printer 1000 is used as the image forming apparatus; however, the image forming apparatus is not limited to the laser printer 1000.

For example, an image forming apparatus may directly emit a laser beam toward a color-producing medium (e.g., paper).

Or an image forming apparatus may include a silver film as an image carrying member. In this case, a latent image is formed on the silver film by optical scanning, and the latent image is visualized by a process similar to a developing process of an ordinary silver halide photography process. Subsequently, the visualized image is transferred onto photographic printing paper by a printing process similar to that carried out in the ordinary silver halide photography process. The image forming apparatus described above may be implemented as an optical plate-making apparatus or an optical plotting apparatus plotting CT scanned images.

Figure 44:
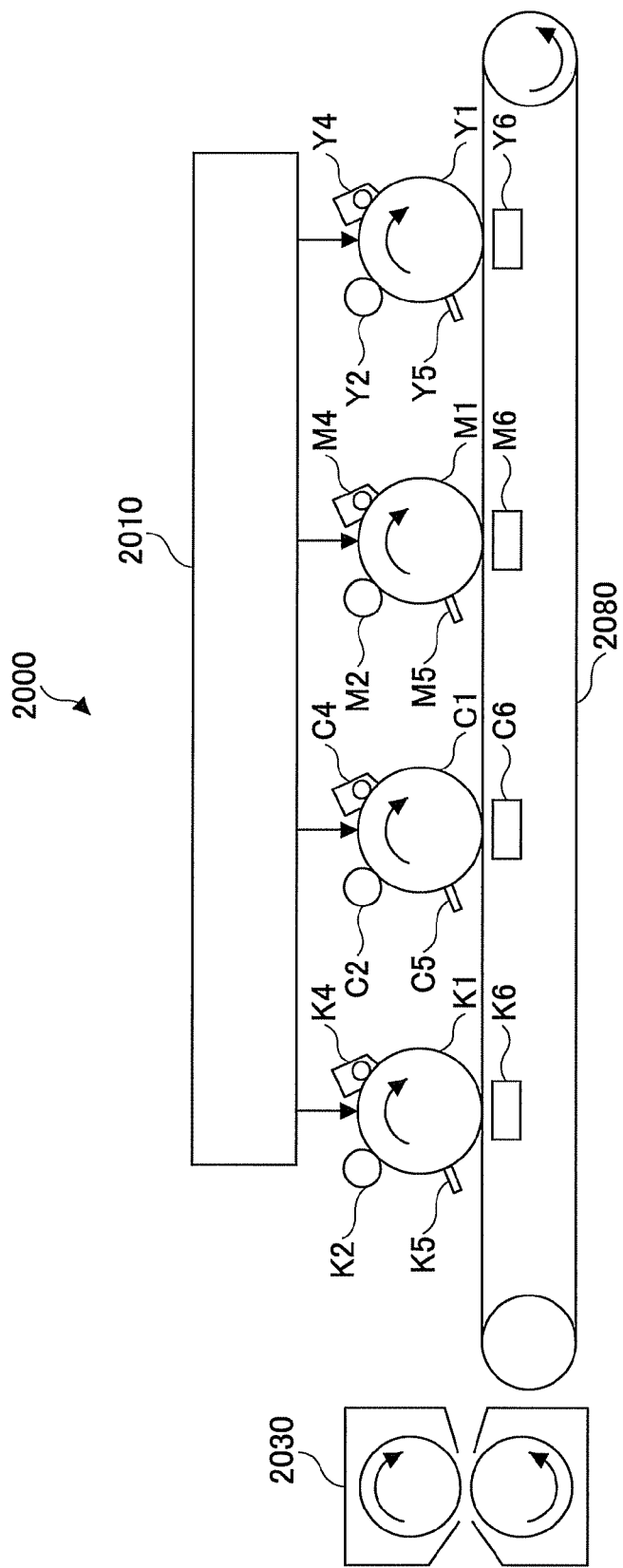
FIG. 44 is a schematic diagram illustrating a color printer.

In addition, the image forming apparatus described above may be a color printer 2000 having plural photoreceptor drums as illustrated in FIG. 44.

The color printer 2000 is a tandem type multi-color printer that forms a full-color image by superposing four colors (black, cyan, magenta, and yellow). The color printer 2000 includes a black set of "a photoreceptor drum K1, a charging device K2, a developing device K4, a cleaning unit K5, and a transfer device K6"; a cyan set of "a photoreceptor drum C1, a charging device C2, a developing device C4, a cleaning unit C5, and a transfer device C6"; a magenta set of "a photoreceptor drum M1, a charging device M2, a developing device M4, a cleaning unit M5, and a transfer device M6"; and a yellow set of "a photoreceptor drum Y1, a charging device Y2, a developing device Y4, a cleaning unit Y5, a transfer device Y6"; an optical scanner device 2010; a transfer belt 2080; and a fixing unit 2030.

As illustrated in FIG. 44, the photoreceptor drums K1, C1, M1, and Y1 are rotated as indicated by respective arrows, and the charging devices K2, C2, M2, and Y2, the developing devices K4, C4, M4, and Y4, the cleaning devices K5, C5, M5, and Y5, and the transfer devices K6, C6, M6, and Y6 are arranged in the peripheries of the respective photoreceptor drums K1, C1, M1, and Y1 along respective rotational directions. The charging devices K2, C2, M2, and Y2 are configured to uniformly charge respective surfaces of the photoreceptor drums K1, C1, M1, and Y1. The respective surfaces of the photoreceptor drums K1, C1, M1, and Y1 are charged by the charging devices K2, C2, M2, and Y2, and the charged surfaces of the photoreceptor drums K1, C1, M1, and Y1 are irradiated with light emitted from the optical scanner device 2010, thereby respective latent images are formed on the photoreceptor drums K1, C1, M1, and Y1. Subsequently, toner images of respective colors are formed on the photoreceptor drums K1, C1, M1, and Y1 by the developing devices K4, C4, M4, and Y4. Thereafter, the toner images of respective colors on the photoreceptor drums K1, C1, M1, and Y1 are transferred by the transfer devices K6, C6, M6, and Y6 onto recording paper on the transfer belt 2080, and a full color image is finally fixed on the recording paper by the fixing unit 2030.

The optical scanner device 2010 includes a light source for each color. The light source for each color may include anyone of a set of the surface-emitting laser elements 100, a set of the surface-emitting laser elements similar to the surface-emitting laser elements 100A, and the surface-emitting laser array similar to the surface-emitting laser array 100M. With this configuration, the optical scanner device 2010 may exhibit effects similar to those obtained by the optical scanner device 1010. Further, since the color printer 2000 includes the optical scanner device 2010, the color printer 2000 may exhibit effects similar to those obtained by the laser printer 1000.

Note that in the color printer 2000, color misalignment may occur due to a fabrication error or locating error of components. However, if the optical scanner device 2010 includes the light sources for respective colors each having the surface-emitting laser array similar to the surface-emitting laser array 100M, the color misalignment may be controlled by selecting appropriate light-emitting portions to emit laser beams.

In one embodiment, there is provided a surface-emitting laser element that includes: a substrate; multiple semiconductor layers stacked on the substrate, the semiconductor layers including a resonator structure including an active layer, a semiconductor multilayer mirror on the resonator structure, and a confined structure where a current passage region is enclosed by at least an oxide generated by oxidation of a part of a selective oxidation layer containing aluminum; an electrode provided around an emission region of a light-emitting surface; and a dielectric film provided in a peripheral portion within the emission region and outside a central portion of the emission region to make a reflectance of the peripheral portion lower than a reflectance of the central portion, where the dielectric film is arranged such that a reflectance of a high-order transverse mode of a laser beam in a second direction perpendicular to a first direction is higher than a reflectance of the high-order transverse mode of the laser beam in the first direction, and where a width of the current passage region in the first direction is greater than a width thereof in the second direction.

With this configuration, the polarization direction may be stabilized and the suppression effect of the high-order transverse mode of a laser beam may be maintained.

In another embodiment, there is provided a surface-emitting laser array having a plurality of the above surface-emitting laser elements.

With this configuration, since the surface-emitting laser array is made by integrating the above plurality of the surface-emitting laser elements, polarization direction may be stabilized and the suppression effect of the high-order transverse mode of a laser beam may be maintained.

In another embodiment, there is provided an optical scanner device optically scanning a scanning surface with light. The optical scanner device includes a light source having the above surface-emitting laser element, a deflector configured to deflect light emitted from the light source, and an scanning optical system configured to converge the light deflected by the deflector onto the scanning surface.

With this configuration, since the optical scanner device includes the light source having the above surface-emitting laser element, optical scanning may be carried out with high accuracy.

In another embodiment, there is provided an optical scanner device optically scanning a scanning surface with light.

The optical scanner device includes a light source having the above surface-emitting laser array, a deflector configured to deflect light emitted from the light source, and a scanning optical system configured to converge the light deflected by the deflector onto the scanning surface.

With this configuration, since the optical scanner device includes the light source having the above surface-emitting laser array, optical scanning may be carried out with high accuracy.

In another embodiment, there is provided an image forming apparatus that includes at least one image carrying member, and at least one of the above optical scanner devices each configured to scan light modulated based on image information on the image carrying member.

With this configuration, since the image forming apparatus includes the above optical scanner device, an image with high image quality may be formed.

As described above, the surface-emitting laser element according to the embodiment is suitable for stabilizing the polarization direction and maintaining the suppression effect of the high-order transverse mode of a laser beam. Further, the surface-emitting laser array according to the embodiment is suitable for stabilizing the polarization directions and maintaining the suppression effect of the high-order transverse mode of a laser beam. Further, the optical scanner device according to the embodiment is suitable for carrying out stable optical scanning. Further, the image forming apparatus according to the embodiment is suitable for forming a high quality image.

Embodiments of the present invention have been described heretofore for the purpose of illustration. The present invention is not limited to these embodiments, but various variations and modifications may be made without departing from the scope of the present invention. The present invention should not be interpreted as being limited to the embodiments that are described in the specification and illustrated in the drawings.

The present application is based on Japanese Priority Applications No. 2009-261510 filed on Nov. 17, 2009, and No. 2010-158487 filed on Jul. 13, 2010, with the Japanese Patent Office, the entire contents of which are hereby incorporated by reference.

What is claimed is:

1. A surface-emitting laser element comprising:
    a substrate;
    multiple semiconductor layers stacked on the substrate, the semiconductor layers including a resonator structure including an active layer, a semiconductor multilayer mirror on the resonator structure, a confined structure where a current passage region s enclosed by at least an oxide generated by oxidation of a part of a selective oxidation layer containing aluminum;
    an electrode provided around an emission region of a light-emitting surface; and
    a dielectric film provided in a peripheral portion within the emission region and outside a central portion of the emission region to make a reflectance of the peripheral portion lower than a reflectance of the central portion,
    wherein the dielectric film is arranged such that a reflectance of a high-order transverse mode of a laser beam in a second direction perpendicular to a first direction is higher than a reflectance of the high-order transverse mode of the laser beam in the first direction, and
    wherein a width of the current passage region in the first direction is greater than a width of the current passage region in the second direction.

2. The surface-emitting laser element as claimed in claim 1, wherein the dielectric film that makes the reflectance of the peripheral portion lower than the reflectance of the central portion is formed in two sub-regions located within the emission region and located outside the central portion of the emission region, and the two sub-regions are arranged such that the two sub-regions mutually face and sandwich the central portion therebetween in the first direction.

3. The surface-emitting laser element as claimed in claim 1, wherein the dielectric film that makes the reflectance of the peripheral portion lower than the reflectance of the central portion is formed such that the dielectric film encloses the central portion of the emission within the emission region.

4. The surface-emitting laser element as claimed in claim 1, wherein the dielectric film that makes the reflectance of the peripheral portion lower than the reflectance of the central portion includes a first end and a second end, and is formed such that the dielectric film partially encloses the central portion of the emission region within the emission region.

5. The surface-emitting laser element as claimed in claim 1, further comprising:
    a multilayer mirror configured to have at least one pair of the dielectric films mutually having different refractive indexes,
    wherein the multilayer mirror is formed in the central portion of the emission region.

6. The surface-emitting laser element as claimed in claim 5, wherein the dielectric film of the multilayer mirror is made of any one of SiNx, SiOx, TiOx, and SiON.

7. The surface-emitting laser element as claimed in claim 5, wherein an optical thickness of the dielectric film of the multilayer mirror is an odd multiple of an oscillation wavelength/4, and
    wherein an optical thickness of the multilayer mirror is an even multiple of an oscillation wavelength/4.

8. The surface-emitting laser element as claimed in claim 1, further comprising:
    a multilayer mirror configured to have at least one pair of the dielectric films mutually having different refractive indexes,
    wherein the multilayer mirror is formed in a portion of the peripheral portion located within the emission region and located outside the central portion of the emission region, the portion of the peripheral portion within the emission region being not provided with the dielectric film that makes the reflectance of the peripheral portion lower than the reflectance of the central portion.

9. The surface-emitting laser element as claimed in claim 1,
wherein the multiple semiconductor layers are etched before the oxidation of the part of the selective oxidation layer containing aluminum such that the multiple semiconductor layers form a mesa structure where the selective oxidation layer is exposed from sides of the mesa structure, and
wherein a width of the mesa structure in the first direction is greater than a width of the mesa structure in the second direction.

10. The surface-emitting laser element as claimed in claim 1,
wherein the substrate is slanted such that a normal direction of a main surface of the substrate is from one direction of a crystal orientation [1 0 0] toward one direction of a crystal orientation [1 1 1].

11. The surface-emitting m as claimed in claim 1,
wherein the dielectric film that makes the reflectance of the peripheral portion lower than the reflectance of the central portion is made of any one of SiNx, SiOx, TiOx, and SiON.

12. The surface-emitting laser element as claimed in claim 1,
wherein an optical thickness of the dielectric film that makes the reflectance of the peripheral portion lower than the reflectance of the central portion is an odd multiple of an oscillation wavelength/4.

13. The surface-emitting laser element as claimed in claim 1,
wherein a region having a high reflectance within the emission region is coated with the dielectric film having an optical thickness of an even multiple of an oscillation wavelength/4.

14. The surface-emitting laser element as claimed in claim 13,
wherein the dielectric film coating the region having the relatively high reflectance within the emission region is made of a material identical to that of the dielectric film that makes the reflectance of the peripheral portion lower than the reflectance of the central portion of the emission region.

15. A surface-emitting laser array comprising a plurality of the surface-emitting laser elements as claimed in claim 1 integrated therein.

16. An optical scanner device optically scanning a scanning surface with light, the optical scanner device comprising:
a light source including the surface-emitting laser array as claimed in claim 15;
a deflector configured to deflect the light emitted from the light source; and
a scanning optical system configured to converge the light deflected by the deflector onto the scanning surface.

17. An image forming apparatus comprising:
at least one image carrying member; and
the optical scanning device as claimed in claim 16 configured to scan light modulated based on image information on the image carrying member.

18. The image forming apparatus as claimed in claim 17,
wherein the image information is multicolored image information.

19. An optical scanner device optically scanning a scanning surface with light, the optical scanner device comprising:
a light source including the surface-emitting laser element as claimed in claim 1;
a deflector configured to deflect the light emitted from the light source; and
a scanning optical system configured to converge the light deflected by the deflector onto the scanning surface.

20. An image forming apparatus comprising:
at least one image carrying member; and
the optical scanning device claimed in claim 19 configured to scan light modulated based on image information on the image carrying member.

* * * * *